(12) United States Patent
Hunt-Schroeder et al.

(10) Patent No.: US 11,112,811 B2
(45) Date of Patent: Sep. 7, 2021

(54) ON-CHIP PARAMETER GENERATION SYSTEM WITH AN INTEGRATED CALIBRATION CIRCUIT

(71) Applicant: Marvell Asia PTE, LTD., Singapore (SG)

(72) Inventors: Eric Hunt-Schroeder, Essex Junction, VT (US); Alexander J. Filmer, Whitesboro, NY (US)

(73) Assignee: MARVELL ASIA PTE, LTD., Singapore (SG)

(*) Notice: Subject to any disclaimer, the term of this patent is extended or adjusted under 35 U.S.C. 154(b) by 0 days.

(21) Appl. No.: 16/748,674

(22) Filed: Jan. 21, 2020

(65) Prior Publication Data

US 2021/0223809 A1  Jul. 22, 2021

(51) Int. Cl.
*G11C 7/00* (2006.01)
*G05F 1/567* (2006.01)
*G11C 5/14* (2006.01)

(52) U.S. Cl.
CPC .............. *G05F 1/567* (2013.01); *G11C 5/14* (2013.01)

(58) Field of Classification Search
CPC ........................................................ G11C 5/14
USPC ........................................................ 365/228
See application file for complete search history.

(56) References Cited

U.S. PATENT DOCUMENTS

| | | | |
|---|---|---|---|
| 7,093,145 B2 | 8/2006 | Werner et al. | |
| 7,459,930 B2 | 12/2008 | Mei | |
| 7,821,246 B2 | 10/2010 | Koertzen et al. | |
| 8,044,677 B2 | 10/2011 | Cremonesi et al. | |
| 8,898,029 B1 | 11/2014 | Wong et al. | |
| 9,111,603 B1 | 8/2015 | Wang et al. | |
| 9,236,863 B2 | 1/2016 | Jones et al. | |
| 9,461,539 B2 | 10/2016 | Chem et al. | |
| 10,305,457 B2 | 5/2019 | Kwon et al. | |
| 10,333,497 B1 | 6/2019 | Kumar et al. | |
| 2002/0171569 A1* | 11/2002 | Zhang | H03M 1/1061 341/120 |
| 2008/0122495 A1 | 5/2008 | Boerstler et al. | |

* cited by examiner

*Primary Examiner* — Hoai V Ho

(57) ABSTRACT

Disclosed are embodiments of an integrated circuit (IC) chip that includes an on-chip parameter generation system. The system includes multiple parameter generators (e.g., voltage generators, current generators, capacitance generators, etc.) and an integrated calibration circuit. The calibration circuit is configured to automatically, sequentially, and repeatedly calibrate the parameter generators in order to minimize chip-to-chip variations in parameters supplied to other on-chip components under real world operating conditions throughout the life of the IC chip. In other words, the integrated calibration circuit effectively minimizes temperature-induced chip-to-chip variations, age-induced chip-to-chip variations, etc. in parameters generated by the on-chip parameter generators. Also disclosed herein are embodiments of an associated method.

17 Claims, 10 Drawing Sheets

ON-CHIP PARAMETER GENERATION SYSTEM WITH AN INTEGRATED CALIBRATION CIRCUIT

BACKGROUND

Field of the Invention

The present invention relates to calibration of parameters (e.g., electrical parameters, such as voltages, currents, capacitances, etc.) generated on-chip and employed during integrated circuit operations. More particularly, the present invention relates to an on-chip parameter generation system with an integrated calibration circuit in order to minimize chip-to-chip variations in calibrated parameters and an associated method.

Description of Related Art

Integrated circuit (IC) chips often require the use of internally generated parameters (i.e., parameters generated by on-chip parameter generators). These internally generated parameters can include, but are not limited to, electrical parameters such as voltages generated at specific levels by voltage generators, currents generated at specific levels by current generators, capacitances generated at specific levels by capacitance generators, etc. The on-chip parameter generators require calibration in order to minimize chip-to-chip parameter variations. Calibration refers to the process of adjusting the settings for the parameter generator in order adjust the internally generated parameter up or down, as necessary, so that the actual level of the parameter falls within an acceptable range of a specific level (referred to herein as a target level).

For example, an on-chip voltage generator may be an N-bit digital-to-analog converter (DAC), which includes a set of resistors including at least one programmable resistor array configured to generate a voltage in response to a particular digital-to-analog (DAC) code received from a control circuit. The control circuit can operate in a calibration mode or an operation mode. During the calibration mode, the control circuit can cause a calibration circuit that is operably connected to the voltage generator to perform a search operation (e.g., a binary search operation or a linear search operation) in order to find the best DAC code to be used for achieving a voltage closest to the target level. Specifically, during the search operation, a voltage generated by the N-bit DAC in response to a given DAC code from the control circuit is compared to a reference voltage at the target level. Depending upon whether the actual level of the voltage is above or below the target level, the DAC code from the control circuit to the N-bit DAC is changed in order to adjust (i.e., decrease or increase, respectively) the voltage from the N-bit DAC by some preset amount (referred to herein as one DAC step, as discussed further in the detailed description section). The comparison and adjustment processes can be repeated until such time as the actual level of the voltage from the N-bit DAC in response to a DAC code is within an acceptable range of the target level (i.e., until the best (or final) DAC code to be used for generating a calibrated voltage is found). During the operation mode, the N-bit DAC can generate this calibrated voltage in response to the final DAC code and this calibrated voltage can be employed for carrying out some on-chip function by another on-chip circuit.

Unfortunately, even when the calibration operation is performed on the voltage generator on each chip, significant chip-to-chip variations can occur in the calibrated voltage. This is because the calibration operation is typically only performed at wafer level test and at a single nominal operating temperature (e.g., 85° C.). However, due to chip-to-chip temperature-induced variations, chip-to-chip age-induced variations, etc. that occur in real world applications (i.e., in chips incorporated into products), the calibrated voltage on different chips may swing higher or lower from what it was during calibration. Furthermore, with device size scaling (e.g., to the 14 nanometer (nm) technology node, the 7 nm technology node, and beyond) the potential swing in the calibrated voltage may result in chip-to-chip variations of 100 millivolts (mV) or more. Product designs may not be able to tolerate such chip-to-chip variations, thereby resulting in significant yield loss.

SUMMARY

Disclosed herein are embodiments of an integrated circuit (IC) chip that includes an on-chip parameter generation system with an integrated calibration circuit. Specifically, the system can include multiple parameter generators for generating parameters at different levels (e.g., voltage generators for generating voltages at different levels, current generators for generating currents at different levels, capacitance generators for generating capacitances, etc.). The system can also include a calibration circuit, which is integrated with the parameter generators, and a controller, which is in communication with the calibration circuit. The controller can cause the system to selectively and alternatively operate in either a calibration mode or a parameter supply mode. During the calibration mode, the controller can cause the calibration circuit to automatically, sequentially, and repeatedly calibrate the parameter generators. As a result of calibration of a specific parameter generator, during the parameter supply mode, the specific parameter generator will generate and output a specific calibrated parameter (e.g., to an additional on-chip circuit) and this specific calibrated parameter will be within a predetermined range of a specific target level for that specific parameter generator (e.g., a target level that is specified for operation of the additional on-chip circuit that receives the specific calibrated parameter). For purposes of this disclosure, automatic, sequential and repeated calibration of parameter generators refers to calibration that occurs automatically in response to signals from the controller, that occurs one parameter generator at a time in a given sequence, and that is repeated such that, following calibration of the last parameter generator in the sequence, calibration of the first parameter generator in the sequence is performed again. By automatically, sequentially, and repeatedly calibrating the parameter generators, chip-to-chip variations in the parameters supplied by the parameter generators to other on-chip components under real world operating conditions and through the life of the IC chip is minimized. In other words, by automatically, sequentially, and repeatedly calibrating the electrical parameter generators, temperature-induced chip-to-chip parameter variations and age-induced chip-to-chip parameter variations are minimized.

In one exemplary embodiment, the integrated circuit (IC) chip includes an on-chip voltage generation system with an integrated calibration circuit. Specifically, the voltage generation system can include multiple voltage generators for generating voltages at different levels. The voltage generation system can also include a calibration circuit, which is connected to each of the voltage generators, and a controller, which is in communication with the calibration circuit. The controller can cause the system to selectively and alternatively operate in either a calibration mode or a voltage supply mode. During the calibration mode, the controller can cause the calibration circuit to automatically, sequentially, and repeatedly calibrate the voltage generators. As a result of calibration of a specific voltage generator, during the voltage supply mode, the specific voltage generator will generate and output a specific calibrated voltage (e.g., to an additional on-chip circuit) and this specific calibrated voltage will be within a predetermined range of a specific target voltage level for the specific voltage generator (e.g., a target voltage level that is specified for operation of the additional on-chip circuit that receives the specific calibrated voltage). For purposes of this disclosure, automatic, sequential and repeated calibration of voltage generators refers to calibration that occurs automatically in response to signals from the controller, that occurs one voltage generator at a time in a given sequence, and that is repeated such that, following calibration of the last voltage generator in the sequence, calibration of the first voltage generator in the sequence is performed again. By automatically, sequentially, and repeatedly calibrating the voltage generators, chip-to-chip variations in the voltages supplied by voltage generators to other on-chip components under real world operating conditions and through the life of the IC chip is minimized. In other words, by automatically, sequentially, and repeatedly calibrating the voltage generators, temperature-induced chip-to-chip voltage variations in supply voltages and age-induced chip-to-chip voltage variations in supply voltages are minimized.

Also disclosed herein are embodiments of a method for operating the above-described parameter generation system. Specifically, the method embodiments can include providing an integrated circuit (IC) chip, as described above, that includes a parameter generation system. The system can include multiple parameter generators for generating parameters at different levels (e.g., voltage generators for generating voltages at different levels, current generators for generating currents at different levels, capacitance generators for generating capacitances, etc.) and a calibration circuit integrated with the parameter generators. The method embodiments can further include selectively and alternatively operating the system in either a calibration mode or a parameter supply mode. Operating the system in the calibration mode can include automatically enabling the calibration circuit in order to automatically, sequentially, and repeatedly calibrate the parameter generators. Operating the system in the parameter supply mode can include automatically disabling the calibration circuit automatically disabling the calibration circuit and further causing the parameter generators to generate and output calibrated parameters, respectively, with each specific calibrated parameter from each specific parameter generator being within a predetermined range of a specific target level for the specific parameter generator (e.g., a target level that is specified for operation of an additional on-chip circuit that receives the specific calibrated parameter). It should be noted that the integrated circuit chip can further include an additional on-chip circuit that is selectively operated in either a standby mode or an operating mode. The disclosed system can be operated in the calibration mode whenever the additional on-chip circuit is in the standby mode. The disclosed system can further be operated in the parameter supply mode to supply calibrated parameters to the additional on-chip circuit whenever the additional on-chip circuit is in the operating mode.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1:
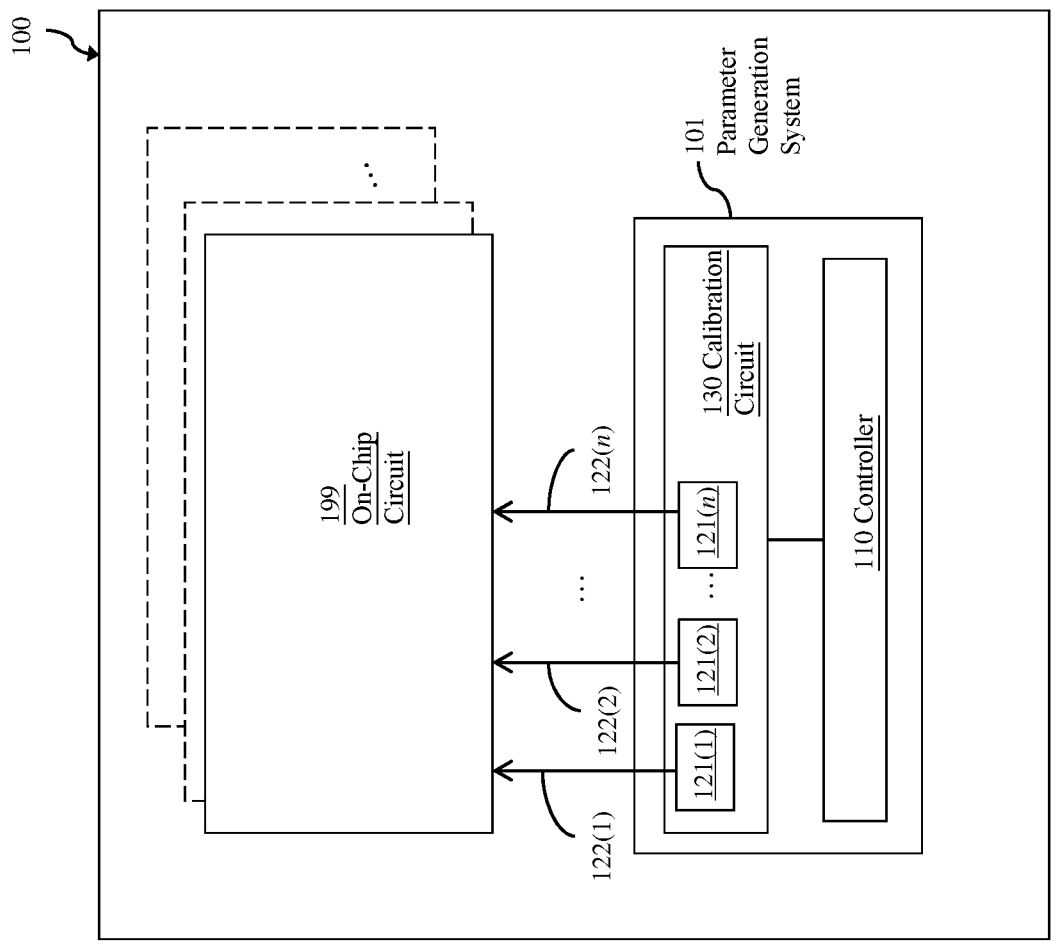
FIG. 1 is a schematic diagram illustrating embodiments of an integrated circuit (IC) chip that includes an on-chip parameter generation system with an integrated calibration circuit.

As mentioned above, integrated circuit (IC) chips often require the use of internally generated parameters (i.e., parameters generated by on-chip parameter generators). These internally generated parameters can include, but are not limited to, electrical parameters such as voltages generated at specific levels by voltage generators, currents generated at specific levels by current generators, capacitances generated at specific levels by capacitance generators, etc. The on-chip parameter generators require calibration in order to minimize chip-to-chip parameter variations. Calibration refers to the process of adjusting the settings for the parameter generator in order to adjust the internally generated parameter up or down, as necessary, so that the actual level of the parameter falls within an acceptable range of a specific level (referred to herein as a target level).

For example, an on-chip voltage generator may be an N-bit digital-to-analog converter (DAC), which includes a set of resistors including at least one programmable resistor array configured to generate voltage in response to a particular digital-to-analog (DAC) code received from a control circuit. The control circuit can operate in a calibration mode or an operation mode. During the calibration mode, the control circuit can cause a calibration circuit that is operably connected to the voltage generator to perform a search operation (e.g., a binary search operation or a linear search operation) in order to find the best DAC code to be used for achieving a voltage closest to the target level. Specifically, during the search operation, a voltage generated by the N-bit DAC in response to a given DAC code from the control circuit is compared to a reference voltage at the target level. Depending upon whether the actual level of the voltage is above or below the target level, the DAC code from the control circuit to the N-bit DAC is changed in order to adjust (i.e., decrease or increase, respectively) the voltage from the N-bit DAC by some preset amount (referred to herein as one DAC step, as discussed further in the detailed description section). The comparison and adjustment processes can be repeated until such time as the actual level of the voltage is within an acceptable range of the target level (i.e., until the best (or final) DAC code to be used for generating a calibrated voltage is found). During the operation mode, the N-bit DAC can generate this calibrated voltage in response to the final DAC code and this calibrated voltage can be employed for carrying out some on-chip function by another on-chip circuit.

Unfortunately, even when the calibration operation is performed on the voltage generator on each chip, significant chip-to-chip variations can occur in the calibrated voltage. This is because the calibration operation is typically only performed at wafer level test and at a single nominal operating temperature (e.g., 85° C.). However, due to chip-to-chip temperature-induced variations, chip-to-chip age-induced variations, etc. that occur in real world applications (i.e., in chips incorporated into products), the calibrated voltage on different chips may swing higher or lower from what it was during calibration. Furthermore, with device size scaling (e.g., to the 14 nanometer (nm) technology node, the 7 nm technology node, and beyond) the potential swing in the calibrated voltage may result in chip-to-chip variations of 100 millivolts (mV) or more. Product designs may not be able to tolerate such chip-to-chip variations, thereby resulting in significant yield loss.

In view of the foregoing, disclosed herein are embodiments of an integrated circuit (IC) chip that includes an on-chip parameter generation system with an integrated calibration circuit. Specifically, the on-chip parameter generation system can include multiple parameter generators (e.g., voltage generators, current generators, capacitance generators, etc.) and a calibration circuit, which is integrated with the parameter generators. The calibration circuit can be configured to automatically, sequentially, and repeatedly calibrate the parameter generators in order to minimize chip-to-chip variations in parameters supplied by these parameter generators to other on-chip components under real world operating conditions throughout the life of the IC chip. In other words, the integrated calibration circuit effectively minimizes temperature-induced chip-to-chip variations, age-induced chip-to-chip variations, etc. in parameters generated by the on-chip parameter generators. Also disclosed herein are embodiments of an associated calibration method for on-chip parameter generators.

More particularly, referring to FIG. 1, disclosed herein are embodiments of an integrated circuit (IC) chip 100 that includes an on-chip parameter generation system 101. The system 101 can include multiple parameter generators 121(1)-121($n$). The parameter generators 121(1)-121($n$) can be configured to generate electrical parameters 122(1)-122($n$) at different levels, respectively, and to output those parameters 122(1)-122($n$) for use by an additional on-chip circuit 199. For purposes of illustration, three parameter generators are shown in FIG. 1. However, it should be understood that the figures are not intended to be limiting. Alternatively, the system 101 could include any number of parameter generators.

The parameter generation system 101 could be a voltage generation system where the parameter generators 121(1)-121($n$) are voltage generators (also referred to as voltage regulators) configured to generate voltages at different levels. Alternatively, the parameter generation system 101 could be a current generation system where the parameter generators 121(1)-121($n$) are current generators configured to generate currents at different levels. Alternatively, the parameter generation system 101 could be a capacitance generation system where the parameter generators 121(1)-121($n$) are capacitance generators configured to generate capacitances at different levels. Alternatively, the parameter generation system 101 could be any other type of parameter generator system with any other type of parameter generators configured to generate any other type of parameter at different levels. Regardless of the type of parameter generation system or the type of parameter generators 121(1)-121($n$) contained therein, the parameter generators 121(1)-121($n$) can be N-bit digital-to-analog converters (DACs) with each N-bit DAC being configured to generate the specific type of parameter at some level in response to a received N-bit digital-to-analog (DAC) code, where N is the number of bits in each DAC code.

The parameter generation system 101 can also include an integrated calibration circuit 130, which can be employed throughout the life of the chip to calibrate the above-described parameter generators 121(1)-121($n$). Additionally, the parameter generation system 101 can include a controller 110, which is in communication with the parameter generators 121(1)-121($n$) and the calibration circuit 130.

Figure 2:
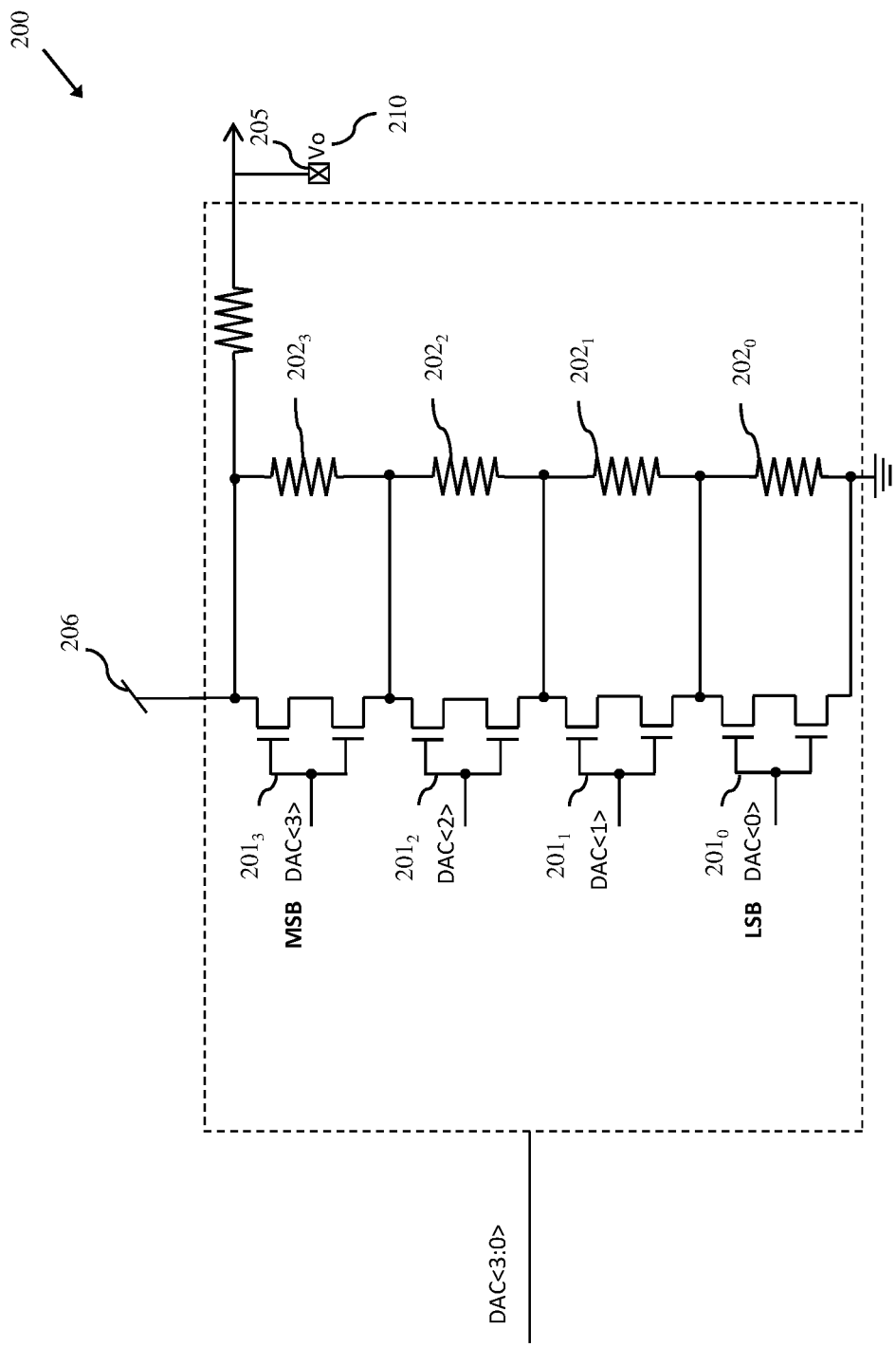
FIG. 2 is a schematic diagram illustrating an exemplary 4-bit DAC configured as a voltage generator.

It should be noted that various different configurations for DAC-based parameter generators (e.g., different DAC-based voltage generators, DAC-based current generators, DAC-based capacitance generators, etc.) are well known in the art. Thus, the details of all of these different configurations have been omitted from this specification in order to allow the reader to focus on the salient aspects of the disclosed embodiments. However, for illustration purposes, FIG. 2 shows a schematic diagram illustrating an exemplary 4-bit DAC 200 configured as a voltage generator. That is, the DAC 200 is configured to generate an analog output voltage (Vo) 210 at an output node 205 in response to a received 4-bit DAC code (DAC<3:0>), which corresponds to a selected one of 0-15 levels (i.e., 0-15 DAC steps) of voltages that can be generated by the DAC 200. The magnitude of any given analog output voltage 210 that is generated by the DAC 200 could be within a predetermined voltage range (Vrange) from a minimum voltage (Vmin) at the lowest DAC step (i.e., DAC step 0) to a maximum voltage (Vmax) at the highest DAC step (i.e., DAC step 15). This DAC 200 includes four switches $201_{0-3}$ in the form of N-type field effect transistor (NFET) pairs connected in series between a positive supply voltage 206 and ground. It further includes a set of resistors $202_{0-3}$ also connected in series between the positive supply voltage 206 and ground. The corresponding switches and resistors can be connected in parallel, thereby forming a resistance ladder. That is, the first switch and first resistor can be connected at a same node to ground. The junction between the first and second switches can be connected to the junction between the first and second resistors. The junction between the second and third switches can be connected to the junction between the second and third resistors. The junction between the third and fourth switches can be connected to the junction between the third and fourth resistors. Finally, the fourth switch and the fourth resistor can be connected at the same node to the positive supply voltage 206. During operation, each switch $201_{0-3}$ can receive a corresponding one of the bits from the received DAC code, turning on the switch in the case of a "1" bit value and turning off the switch in the case of a "0" bit value. Depending upon the value of the different bits in the received 4-bit DAC code from the most significant bit (MSB) to the least significant bit (LSB), the magnitude of the analog output voltage 210 output from the DAC 200 at the output node 205 can be selectively varied and, more particularly, increased or decreased by one or more DAC steps (e.g., by 5 mV DAC steps across the full voltage range). Those skilled in the art will recognize that, for a given voltage generator, the DAC is typically configured so that the target voltage level will ideally be generated in response to a DAC code that corresponds to a DAC step at the midpoint of the voltage range (e.g., in response to a DAC code corresponding to DAC step 8 of the 0-15 DAC steps). Again, it should be noted that the 4-bit DAC 200 shown in FIG. 2 and described above is provided for illustration purposes and is not intended to be limiting.

Figure 3:
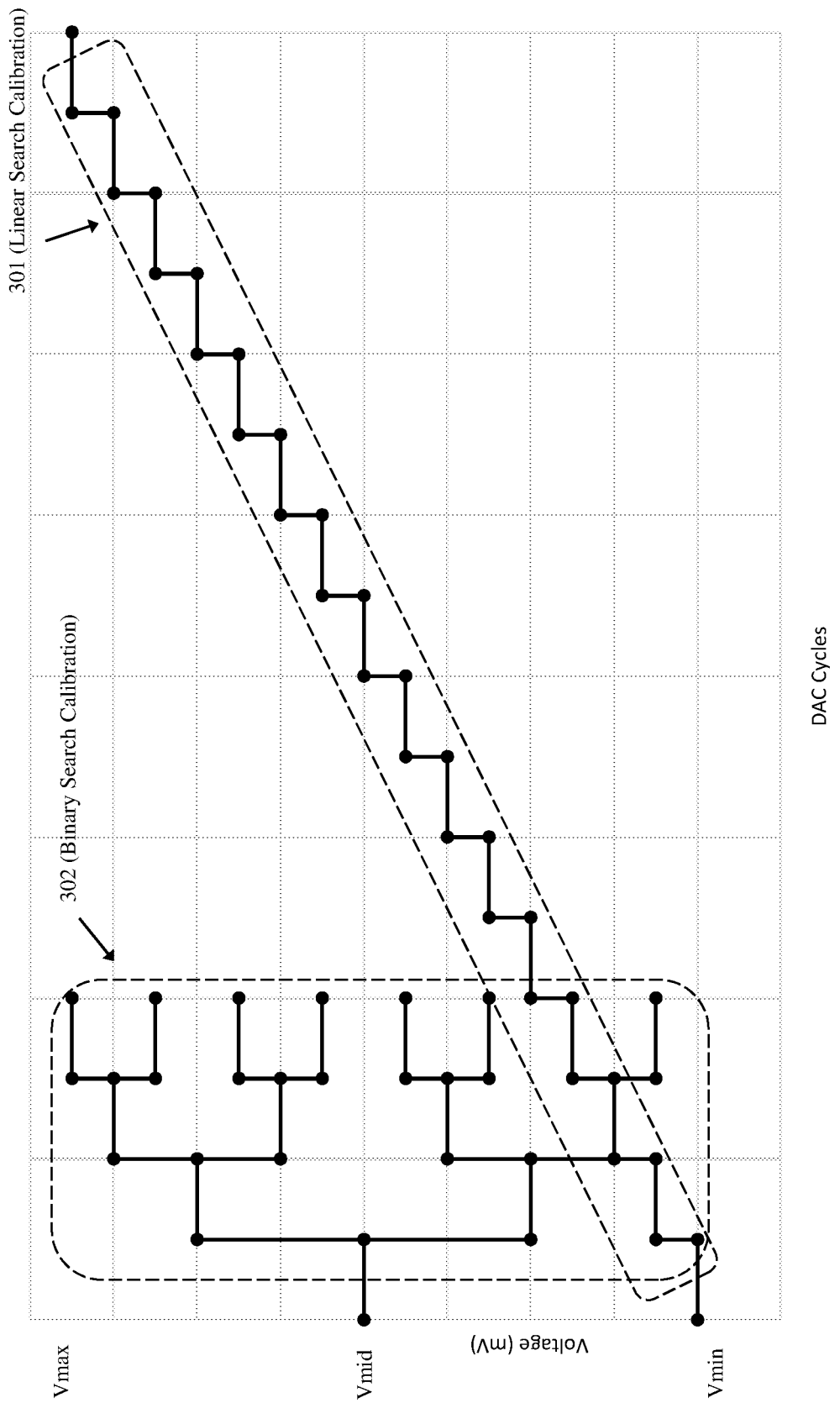
FIG. 3 is a graph illustrating linear and binary search calibration operations.

In the prior art, a voltage generation system that included such a voltage generator might also include a corresponding calibration circuit, which is connected to the voltage generator, and a controller, which is in communication with the voltage generator and the calibration circuit. The calibration circuit, as controlled by the controller, would perform a search calibration operation at wafer level test at a single operating temperature (as discussed above) in order to account for chip-to-chip process variations that occur during manufacturing and, specifically, in order to pick a chip-specific DAC code that will be used by the voltage generator to generate an analog voltage at the output node once the chip is operational and throughout the life of the chip. The search calibration operation could be either a linear search calibration operation 301 or a binary search calibration operation 302, as shown in FIG. 3. In a linear search calibration operation, an analog voltage is generated at the lowest DAC step and compared to a reference voltage at the target voltage level. The DAC steps are progressively increased until the calibration signal from the calibration circuit indicates HOLD instead of ADD. Thus, for a 0-15 step DAC, the linear search calibration operation 301 could take anywhere from 1 to 16 DAC cycles to complete. In a binary search calibration operation, an analog voltage is generated at the middle DAC step and compared to a reference voltage at the target voltage level. The DAC steps are progressively increased or decreased until the calibration signal from the calibration circuit indicates HOLD instead of ADD or SUBTRACT. Thus, for a 0-15 step DAC, the binary search calibration operation 302 could take anywhere from 1 to 4 DAC cycles to complete. Unfortunately, as discussed above, due to chip-to-chip temperature-induced variations, chip-to-chip age-induced variations, etc. that occur in real world applications (i.e., in chips incorporated into products), the calibrated voltage on different chips may swing higher or lower from what it was during calibration and product designs may not be able to tolerate such chip-to-chip variations, thereby resulting in significant yield loss. That is, the chip-specific DAC code determined at wafer level test may not be the best DAC code for generating an analog voltage at the target level.

This same problem can be seen with other N-bit DAC-based parameter generators (e.g., N-bit DAC-based current generators, N-bit DAC-based capacitance generators, etc.). That is, the chip-specific N-bit DAC code determined during calibration of a specific parameter generator at wafer level test may not continue to be the best N-bit DAC code for generating the analog parameter at the target level through-out the life of the chip. Thus, as mentioned above, the parameter generation system 101 disclosed herein also includes the calibration circuit 130 and the controller 130. Specifically, the parameter generation system 101 can include a calibration circuit 130, which is integrated with the parameter generators 121(1)-121(n), and a controller 110, which is in communication with the parameter generators 121(1)-121(n) and the calibration circuit 130.

More specifically, the controller 110 can cause the parameter generation system 101 to selectively and alternatively operate in either a calibration mode or a parameter supply mode. To accomplish this, the controller 110 can monitor the additional on-chip circuit 199 to determine whether or not it is in a standby mode or in an operating mode requiring the use of the parameters at the different levels. Depending upon whether or not the additional on-chip circuit 199 is in the standby or operating mode, the controller 110 can cause the parameter generation system 101 to be selectively and alternatively operated in either a calibration mode or a parameter supply mode, respectively. For purposes of this disclosure, "selectively and alternatively operated in either a calibration mode or a parameter supply mode," means that the system is operated in either the calibration mode or the parameter supply mode but not both modes concurrently.

During each calibration mode, the controller 110 can automatically enable the calibration circuit 130 so that the calibration circuit 130 can automatically, sequentially, and repeatedly calibrate the parameter generators 121(1)-121(n).

During the parameter supply mode, the controller 110 can automatically disable the calibration circuit 130 and the parameter generators 121(1), 121(2) . . . 121(n) will automatically generate and output calibrated parameters 122(1), 122(2) . . . or 122(n) to the additional on-chip circuit 199. Due to previous calibration during the calibration mode, each specific calibrated parameter generated and output by each specific parameter generator will be within a predetermined range of a specific target level for that specific parameter generator (e.g., a target level that is specified for operation of the additional on-chip circuit that receives the specific calibrated parameter).

It should be noted that to ensure proper functioning of the additional on-chip circuit 199, the calibration circuit 130 is only enabled by the controller 110 whenever the additional on-chip circuit 199 is in the standby mode and is disabled by the controller 110 whenever the additional on-chip circuit 199 is the operating mode. When the additional on-chip circuit 199 is in the operating mode and calibration is disabled, the N-bit DAC codes used to generate the specific calibrated parameters 122(1)-122(n) output from the specific parameter generators 121(1)-121(n), respectively, to the additional on-chip circuit 199 will be latched (i.e., will remain constant) in order to avoid changes in the specific parameters during additional on-chip circuit operation.

For example, in one exemplary embodiment, the additional on-chip circuit 199 could be a memory circuit that is selectively operable in either a standby mode or an operating mode. The parameter generators 121(1)-121(n) can be voltage generators, which provide supply voltages at different levels (i.e., different supply voltages) to this memory circuit so that the memory circuit can perform various functions when in an operating mode (as opposed to a standby mode). Consider a flash memory circuit that requires supply voltages at different levels in order to perform read, write and erase functions. Adjusting the level of any of these supply voltages mid-function (i.e., during the read, write or erase functions) could result in a read, write or erase failure. Therefore, the calibration circuit 130 of the system 101 must be disabled by the controller 110 during the operating mode of the memory circuit and the N-bit DAC codes used by the specific voltage generators to generate the supply voltages must be latched so that they remain unchanged during the operation mode and, thus, so that the supply voltages remain unchanged during the operation mode.

For purposes of this disclosure, automatic, sequential and repeated calibration of parameter generators (e.g., voltage generators, current generators, capacitance generators, etc.) refers to calibration that occurs automatically in response to signals from the controller 110, that occurs one parameter generator at a time in a given sequence, and that is repeated such that, following calibration of the last parameter generator in the sequence, calibration of the first parameter generator in the sequence is performed again. By automatically, sequentially, and repeatedly calibrating the parameter generators, chip-to-chip variations in the parameters supplied by the parameter generators to other on-chip components under real world operating conditions and throughout the life of the IC chip are minimized. In other words, by automatically, sequentially, and repeatedly calibrating the parameter generators, temperature-induced chip-to-chip parameter variations, age-induced chip-to-chip parameter variations, etc. are minimized.

FIGS. 4A-4B and 5A-5B are schematic diagrams illustrating, in greater detail, two different embodiments of an on-chip parameter generation system 401, 501 (e.g., of an on-chip voltage generation system or other type of on-chip parameter generation system).

In each of these embodiments, the system 401, 501 includes multiple parameter generation blocks 420(1)-420(n), 520(1)-520(n) (e.g., multiple voltage generation blocks or other type of parameter generation blocks), a calibration circuit 430, 530 integrated with the parameter generation blocks 420(1)-420(n), 520(1)-520(n) and a controller 410, 510 in communication with the calibration circuit 430, 530.

Each parameter generation block 420(1)-420(n), 520(1)-520(n) includes a primary parameter generator 421(1)-421(n), 521(1)-521(n) and, particularly, a primary N-bit DAC-based parameter generator (e.g., a primary voltage generator, which is configured, for example, in the same manner as an N-bit DAC-based voltage generator, such as the 4-bit DAC 200 shown in FIG. 2). During a parameter supply mode (e.g., a voltage supply mode), the primary parameter generators 421(1)-421(n), 521(1)-521(n) in the parameter generation blocks 420(1)-420(n), 520(1)-520(n) receive generator-specific DAC codes DAC(1)<N:0>-DAC(n)<N:0> and, in response, provide calibrated parameters 422(1)-422(n), 522(1)-522(n) to an additional on-chip circuit (not shown). The initial generator-specific DAC codes DAC(1)<N:0>-DAC(n)<N:0> can be determined, for example, by calibration at wafer level test. However, to avoid failures resulting from temperature-induced chip to chip variations, age-induced chip to chip variations, these generator-specific DAC codes DAC(1)<N:0>-DAC(n)<N:0> can be changed throughout the life of the chip whenever the additional on-chip circuit switches from an operating mode to a standby mode and, in response, the controller 410, 510 enables the parameter generation system 401 to operate in a calibration mode. During the calibration mode, automatic, sequential, and repeated calibration of the primary parameter generators 421(1)-421(n), 521(1)-521(n) is performed to increase or decrease the DAC step of the primary parameter generators, as necessary, to achieve the target parameter level of the primary parameter generators.

To accomplish automatic, sequential, and repeated calibration of the primary parameter generators 421(1)-421(n), 521(1)-521(n), the integrated calibration circuit 430, 530 can include, within the parameter generation blocks 420(1)-420(n), 520(1)-520(n), corresponding pairs of secondary parameter generators 421(1)H and 421(1)L, 421(2)H and 421(2)L, . . . and 421(n)H and 421(n)L, 521(1)H and 521(1)L, 521(2)H and 521(2)L, . . . and 521(n)H and 521(n)L (e.g., corresponding pairs of secondary voltage generators). Each pair of secondary parameter generators in a given parameter generation block can be a duplicate of the primary parameter generator. The integrated calibration circuit 430, 530 can further include, within each parameter generation block 420(1)-420(n), 520(1)-520(n), additional logic (not shown) configured to supply the secondary parameter generators with DAC codes that correspond to one DAC step above and one DAC step below, respectively, than the DAC code received by the primary parameter generator. Thus, the outputs of the pairs of secondary parameter generators in the parameter generation blocks will each be one DAC step higher (referred to herein as high-level outputs) and one DAC step lower (referred to herein as low-level outputs) than the outputs (referred to herein as mid-level outputs) of the corresponding primary parameter generators.

Figure 4A:
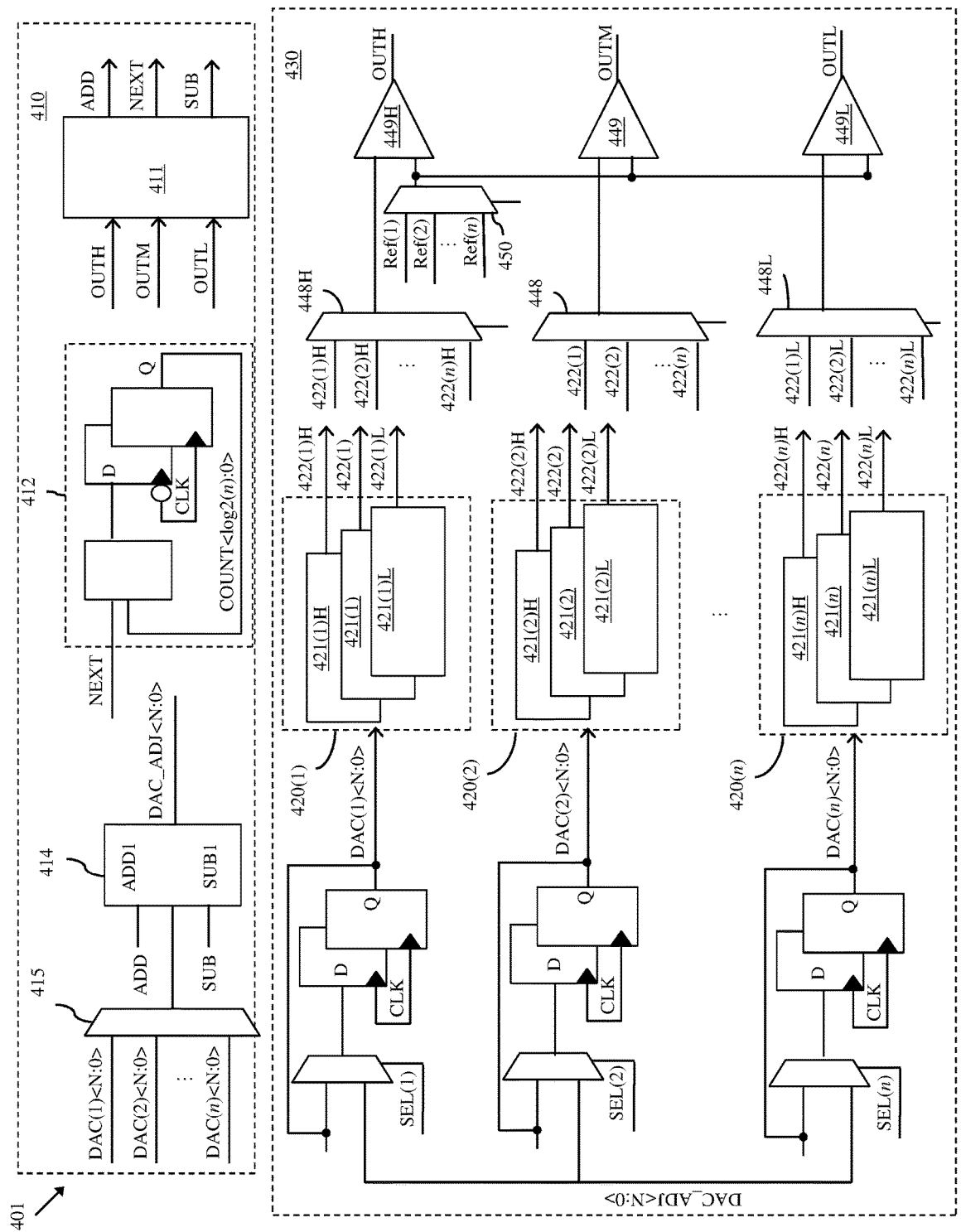
FIG. 4A is a schematic diagram illustrating an embodiment of on-chip parameter generation system (e.g., an on-chip voltage generation system or other on-chip parameter generation system)
Figure 4B:
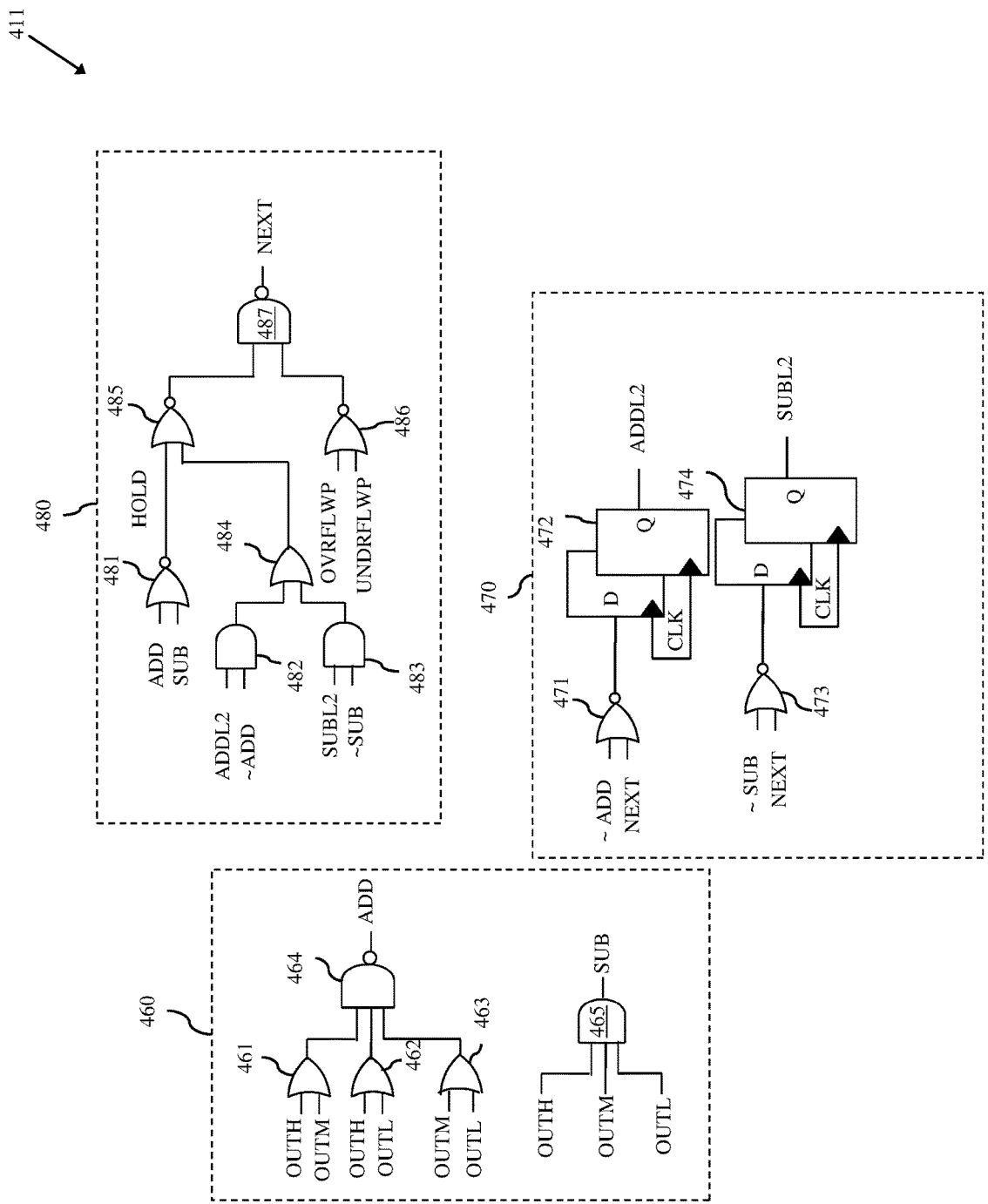
FIG. 4B is a schematic diagram illustrating an exemplary control logic block that can be incorporated into the on-chip parameter generation system of FIG. 4A.

Referring to the embodiment of the system 401 shown in FIGS. 4A-4B, the outputs of all three of the parameter generators in any given parameter generation block are employed in order to calibrate the primary parameter generator of that block. As discussed above, the high and low-level outputs 422(1)H and 422(1)L, 422(2)H and 422(2)L, . . . and 422(n)H and 422(n)L of the pairs of secondary parameter generators 421(1)H and 421(1)L, 421(2)H and 421(2)L, . . . and 421(n)H and 421(n)L, respectively, in the parameter generation blocks will each be one DAC step higher and one DAC step lower than the mid-level outputs 422(1), 422(2), . . . and 422(n) of the corresponding primary parameter generators 421(1), 421(2), . . . and 421(n). Specifically, the calibration circuit 430 can further include three calibration input multiplexors: a first calibration input multiplexor 448H that receives the high-level outputs 422(1)H, 422(2)H, . . . and 422(n)H from each of the parameter generation blocks 420(1), 420(2), . . . , and 420(n); a second calibration input multiplexor 448L that receives the low-level outputs 422(1)L, 422(2)L, . . . and 422(n)L from each of the parameter generation blocks 420(1)-420(n); and a third calibration input multiplexor 448 that receives the mid-level outputs 422(1), 422(2), . . . and 422(n) from each of the parameter generation blocks 420(1), 420(2), . . . and 420(n).

The calibration circuit 430 can further include a reference multiplexor 450 that receives reference parameters Ref(1), Ref(2), Ref(n) at the target level for the outputs of each of the primary parameter generators 421(1)-421(n), respectively. For example, in the case where the parameter generation system 401 is a voltage generation system, these reference parameters Ref(1), Ref(2), . . . Ref(n) can be known and fixed reference voltages (Vrefs) at the target levels for the outputs of the voltage generators, respectively. The known and fixed reference voltages (Vrefs) can be, for example, bandgap reference voltages.

The calibration circuit 430 can further include three comparators including: a first comparator 449H that receives the outputs of the multiplexors 448H and 450, as inputs; a second comparator 449L that receives the outputs of the multiplexors 448L and 450, as inputs; and a third comparator 449 that receives the outputs of the multiplexors 448 and 450 as inputs. As mentioned above, calibration of the primary parameter generators 421(1)-421(n) is performed automatically, sequentially, and repeatedly when the system 401 is operating in a calibration mode.

During calibration of a given primary parameter generator (e.g., 421(1)), control signals will cause the high-level, low-level and mid-level outputs (e.g., 422(1)H, 422(1)L and 422(1)) from the given primary parameter generator to be selected by the first, second and third calibration input multiplexors 448H, 448L and 448 and applied to the first, second and third comparators 449H, 449L and 449, respectively, and will further cause the corresponding reference parameter (e.g., Ref(1)) to be received by the first, second and third comparators 449H, 449L and 449. The first comparator 449H can compare the high-level output (i.e., DAC+1) to the reference parameter and output a first calibration signal (OUTH). The second comparator 449L can compare the low-level output (i.e., DAC−1) to the reference parameter and output a second calibration signal (OUTL). The third comparator 449 can compare the mid-level output (i.e., DAC) to the reference parameter and output a third calibration signal (OUTM).

During calibration of the given primary parameter generator (e.g., 421(1)), the controller 410 can receive the first, second and third calibration signals (OUTH, OUTL, and OUTM) and, in response during a next clock cycle, can either ADD one DAC step (i.e., change the DAC code for the given primary parameter generator so that it corresponds to the next higher DAC step), SUBTRACT one DAC step (i.e., change the DAC code for the given primary parameter generator so that it corresponds to the next lower DAC step), or HOLD the DAC code at the current DAC step because the calibration of the specific parameter generator has been achieved. The controller 410 can also stop calibration of the given primary parameter generator when certain conditions are met and trigger calibration of the next primary parameter generator in the sequence (e.g., to 421(2)).

Specifically, the controller 410 can include a control logic block 411, an adder 414, and an N-bit counter 412.

During calibration of a given parameter generator (e.g., 421(1)), the control logic block 411 can receive the first, second and third calibration signals (OUTH, OUTL, and OUTM) and can be configured to output ADD, SUB, and NEXT signals in response to those calibration signals. An ADD signal at a logic "1" can indicate that the DAC step for the given parameter generator should be increased by one step in the next cycle, whereas an ADD signal at a logic "0" can indicate that the DAC step for the given parameter generator should not be increased in the next cycle. A SUB signal at a logic "1" can indicate that the DAC step for the given parameter generator should be decreased by one step in the next cycle, whereas a SUB signal at a logic "0" can indicate that the DAC step for the given parameter generator should not be decreased in the next cycle. A NEXT signal at a logic "0" can indicate that calibration of the given primary parameter generator should continue in the next cycle, whereas a NEXT signal at a logic "1" can cause calibration of the given primary parameter generator (e.g., 421(1)) to end and trigger initiation of calibration of the next primary parameter generator in the sequence (e.g., 421(2)).

The adder 414 can receive the current DAC code for the given primary parameter generator from a multiplexor 415 and can also receive the ADD and SUB signals from the control logic block 411 and, based on the ADD and SUB signals, can output a new DAC code (DAC_ADJ<N:0>) for that given parameter generator. If the ADD and SUB signals are both logic "0", the new DAC code will be the same as the previous DAC code. If the ADD signal is a logic "0" and the SUB signal is a logic "1", then the new DAC code will correspond to a DAC step that is one lower. If the ADD signal is a logic "1" and the SUB signal is a logic "0", then the new DAC code will correspond to a DAC step that is one higher.

The N-bit counter 412 can receive the NEXT signal. When the NEXT signal is a logic "0", the N-bit counter 412 can cause calibration of the given parameter generator to continue in the next cycle. When the NEXT signal is a logic "1", the N-bit counter 412 can cause calibration of the next parameter generator in the sequence to be initiated in the next cycle. It should be noted that, when the given parameter generator being calibrated is the last one in the sequence (i.e., 421(n)) and the NEXT signal is a logic "1", the N-bit counter 412 can cause calibration of the first one (i.e., 421(1)) in the sequence to be repeated and so on. It should also be noted that the particular order in which the parameter generators 421(1)-421(n) are calibrated could be established based on whether the parameter that is output from one generator is dependent on the parameter that is output from another. For example, in one exemplary voltage generation system, a first voltage generator could generate a first voltage and a second voltage generator could generate a second voltage, where the level of the second voltage is dependent upon the level of the first voltage. In this case, the order in which the parameter generators are calibrated could be established by design so that the second voltage generator should be calibrated following the first voltage generator. However, since the calibration procedure is automatically repeated in a round-robin fashion (i.e., since calibration of the parameter generators 421(1)-421(n) is automatically, sequentially, and repeatedly performed), it is not necessary to establish the order based on whether the parameter that is output from one generator is dependent on the parameter that is output from another.

As mentioned above, the control logic block 411 can be configured to output the NEXT signal. Specifically, the control logic block 411 can be configured to switch the NEXT signal to a logic "1" when both the ADD and SUB signals are at logic "0", thereby indicating that no change to the current DAC code is necessary and that calibration is complete. Optionally, the control logic block 411 can also be configured to switch the NEXT signal to a logic "1" when any of the following conditions occur: (a) the adder 414 is a ripple carry adder, the maximum level of the adder has been reached (i.e., the highest DAC step has been reached), and the ADD signal is at a logic "1" (referred to herein as an overflow state (OVRFLWP); (b) the adder 414 is a ripple carry adder, the minimum level of the adder has been reached (i.e., the lowest DAC step has been reached) and the SUB signal is at a logic "1" (referred to herein as an underflow state (UNDRFLWP); or (c) chatter occurs from cycle to cycle (i.e., the calibration results from one cycle to the next are ADD at logic "1", SUB at logic "1", ADD at logic "1", and so on indicating that there is overlap in the trip point between the comparators due to process mismatch in transistors).

FIG. 4B is a schematic diagram illustrating an exemplary control logic block 411 that could be incorporated into the system 401 of FIG. 4A. The control logic block 411 can include a first logic section 460, a second logic section 470 and a third logic section 480.

The first logic section 460 can include an ADD portion and a SUB portion. The ADD portion can include three two-input OR gates 461-463 connected to a three-input NAND gate 464. The two-input OR gates 461, 462 and 463 can receive the OUTH and OUTM signals, the OUTH and OUTL signals, and the OUTM and the OUTL signals, respectively, and can each process the received signals according to a conventional OR gate truth tables. That is, the output of any of the OR gates will be a logic "0" whenever both of the received signals are logic "0"s, otherwise it will be a logic "1". The outputs of the OR gates 461-463 can be received and processed by the three-input NAND gate 464 according to a conventional three-input NAND gate truth table to output the ADD signal. That is, the ADD signal will only be a logic "0" when all three inputs from the OR gates are logic "1"s, otherwise it will be a logic "1". The SUB portion can include a three-input AND gate 465, which receives, as inputs, the OUTH, OUTM and OUTL signals and outputs the SUB signal according to a conventional three-input AND gate truth table. Thus, the SUB signal will be a logic "1" only if OUTH, OUTM and OUTL are all logic "1"s, otherwise it will be a logic "0".

The second logic section 470 can include an ADDL2 portion and a SUBL2 portion. The ADDL2 portion can include a NOR gate 471 and a latch 472. The NOR gate 471 can receive, as inputs, the ~ADD (bitwise negation) signal and the current NEXT signal and process those signals according to a conventional NOR gate truth table. That is, the output of the NOR gate will be a logic "1" when both the ~ADD (bitwise negation) and current NEXT signals are logic "0"s, otherwise it will be a logic "0". The latch 472 can latch the output from the NOR gate 471, outputting an ADDL2 signal. The SUBL2 portion can include a NOR gate 473 and a latch 474. The NOR gate 473 can receive, as inputs, the ~SUB (bitwise negation) signal and the current NEXT signal and process those signals according to a conventional NOR gate truth table. That is, the output of the NOR gate 473 will be a logic "1" when both the ~SUB (bitwise negation) and current NEXT signals are logic "0"s, otherwise it will be a logic "0". The latch 474 can latch the output from the NOR gate 473, outputting an SUBL2 signal.

The third logic section 480 can include: a NOR gate 481; two AND gates 482 and 483; an OR gate 484; a NOR gate 485; a NOR gate 486; and a NAND gate 487. The NOR gate 481 can receive and process the ADD and SUB signals. The AND gate 482 can receive and process the ADDL2 and ADD signals. The AND gate 483 can receive and process the SUBL2 and SUB signals. The OR gate 484 can receive and process the outputs of the AND gates 482 and 483. The NOR gate 485 can receive and process the outputs of the NOR gate 481 and the OR gate 484. The NOR gate 486 can receive and process overflow (OVRFLWP) and underflow (UNDRFLWP) signals. Finally, the NAND gate 487 can receive and process the outputs of the NOR gates 485 and 486, outputting the NEXT signal, which will be a logic "0" if the outputs of the NOR gates 485 and 486 are both logic "1"s, otherwise it will be a logic "1".

With this configuration, the NEXT signal at the output of the NAND gate 487 in the third logic section 480 will switch from a logic "0" to a logic "1" when any of the following conditions occur: (a) both the ADD and SUB signals are at logic "0"; (b) OVRFLWP is at a logic "1"; (c) UNDRFLWP is at a logic "1"; or (d) ADD is at logic "1" and SUB is at logic "1" in the follow-on cycle or vice versa (i.e., when there is chatter between two adjacent DACs in sequential cycles).

Figure 5A:
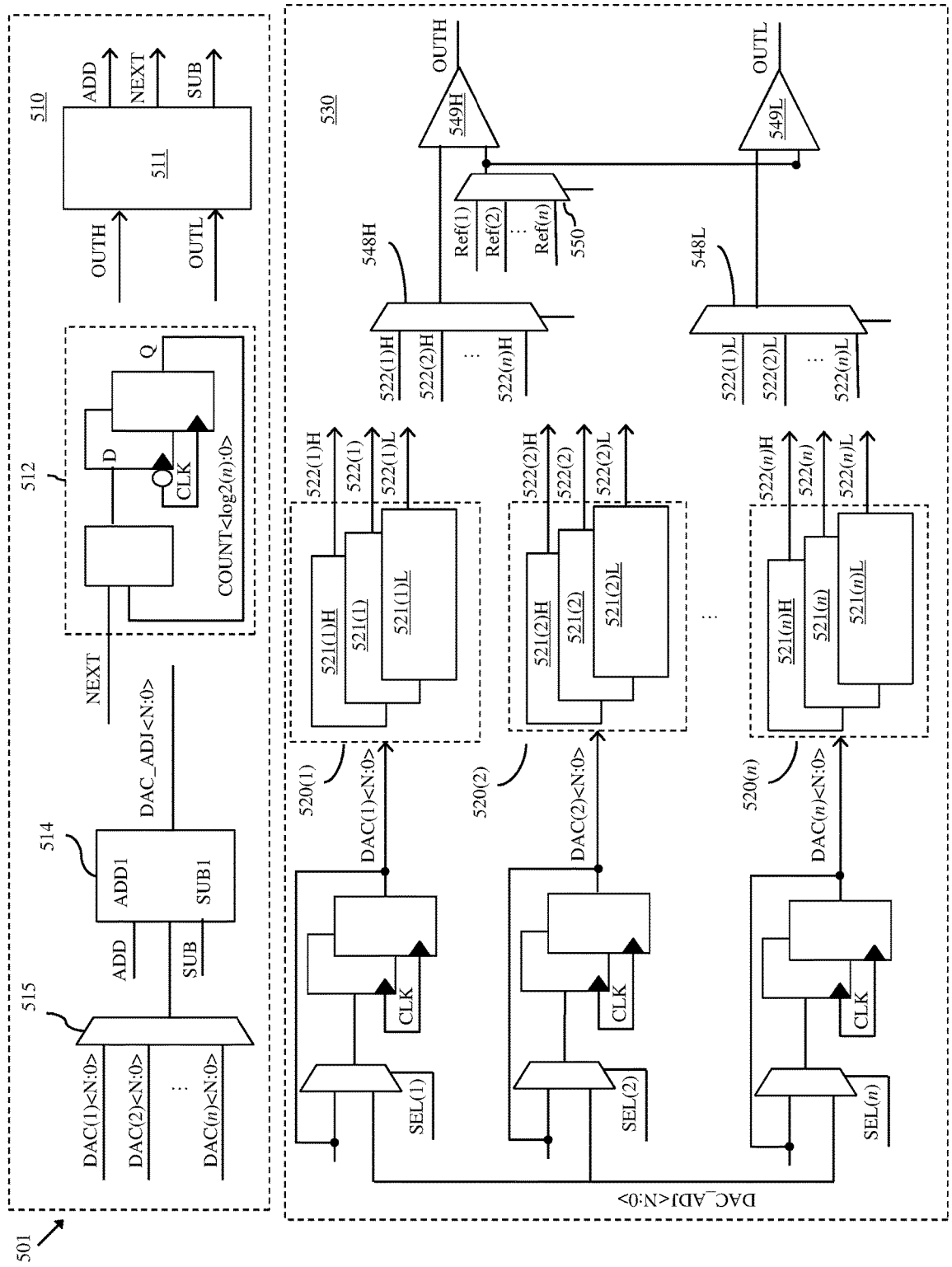
FIG. 5A is a schematic diagram illustrating another embodiment of on-chip parameter generation system (e.g., another on-chip voltage generation system or other on-chip parameter generation system)
Figure 5B:
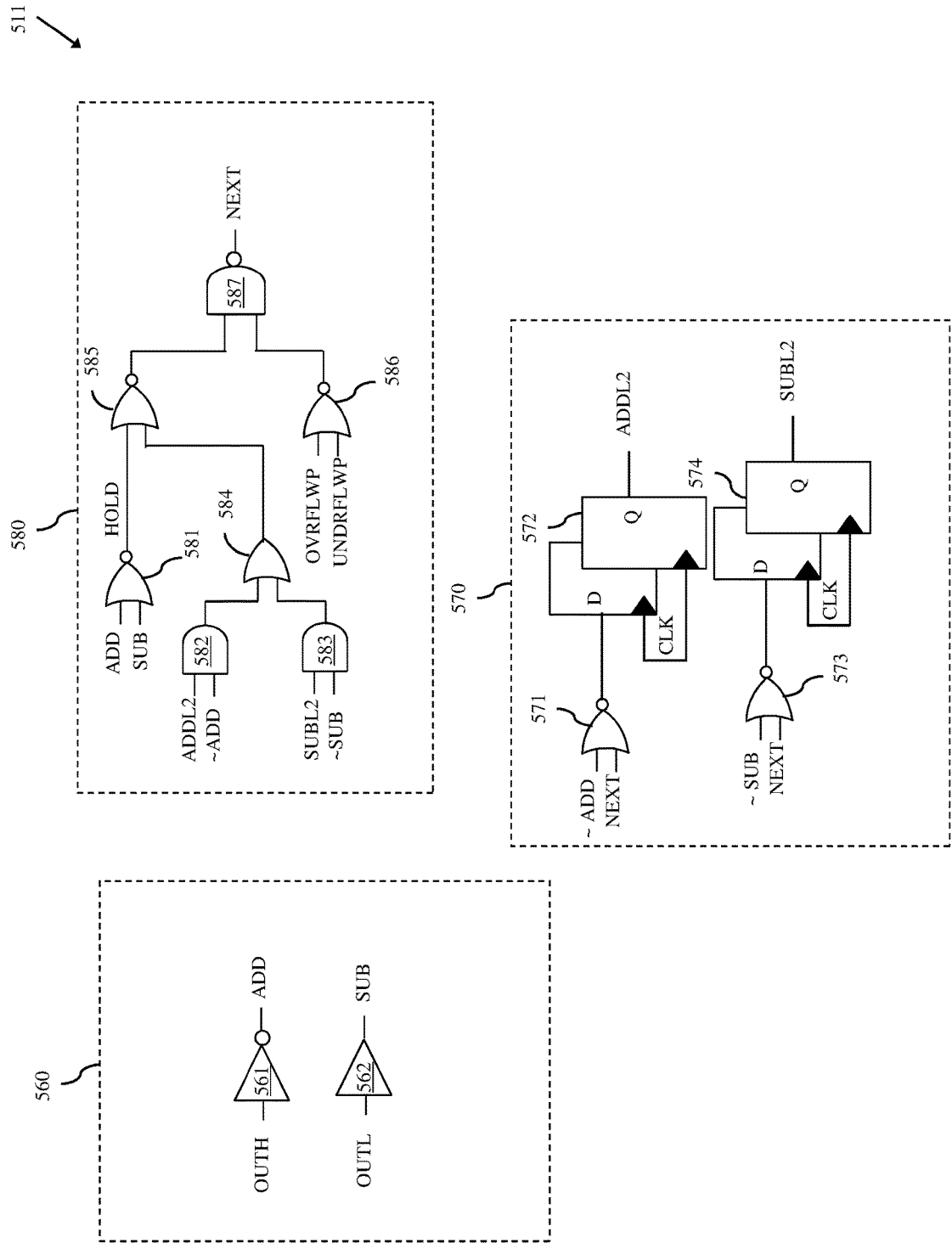
FIG. 5B is a schematic diagram illustrating an exemplary control logic block that can be incorporated into the on-chip parameter generation system of FIG. 5A.

Referring to the embodiment of the system 501 shown in FIGS. 5A-5B, the outputs of only the secondary parameter generators in any given parameter generation block are employed in order to calibrate the primary parameter generator of that block. As discussed above, the high and low-level outputs 522(1)H and 522(1)L, 522(2)H and 522(2)L, . . . and 522(n)H and 522(n)L of the pairs of secondary parameter generators 521(1)H and 521(1)L, 521(2)H and 521(2)L, . . . and 521(n)H and 521(n)L in the parameter generation blocks will each be one DAC step higher and one DAC step lower, respectively, than the mid-level outputs 522(1), 522(2), . . . and 522(n) of the corresponding primary parameter generators 521(1), 521(2), . . . and 521(n). Specifically, the calibration circuit 530 can further include two calibration input multiplexors: a first calibration input multiplexor 548H that receives the high-level outputs 522(1)H, 522(2)H, . . . and 522(n)H from each of the parameter generation blocks 520(1), 520(2), . . . , and 520(n); and a second calibration input multiplexor 548L that receives the low-level outputs 522(1)L, 522(2)L, . . . and 522(n)L from each of the parameter generation blocks 520(1)-520(n).

The calibration circuit 530 can further include a reference multiplexor 550 that receives reference parameters Ref(1), Ref(2), . . . Ref(n) at the target level for the outputs of each of the primary parameter generators 521(1)-521(n), respectively. For example, in the case where the system 501 is a voltage generation system, these reference parameters Ref(1), Ref(2), . . . Ref(n) can be known and fixed reference voltages (Vrefs) at the target levels for the outputs of the voltage generators, respectively (e.g., bandgap reference voltages).

The calibration circuit 530 can further include two comparators including: a first comparator 549H that receives the outputs of the multiplexors 548H and 550, as inputs, and a second comparator 549L that receives the outputs of the multiplexors 548L and 550, as inputs. As mentioned above, calibration of the primary parameter generators 521(1)-521(n) is performed automatically, sequentially, and repeatedly when the system 501 is operating in a calibration mode.

During calibration of a given primary parameter generator (e.g., 521(1)), control signals will cause the high-level and low-level outputs (e.g., 522(1)H and 522(1)L) from the given primary parameter generator be selected by the first and second calibration input multiplexors 548H and 548L and applied to the first and second comparators 549H and 549L, respectively, and will further cause the corresponding reference parameter (e.g., Ref(1)) to be received by the first and second comparators 549H and 549L. The first comparator 549H can compare the high-level output (i.e., DAC+1) to the reference parameter and output a first calibration signal (OUTH). The second comparator 549L can compare the low-level output (i.e., DAC−1) to the reference parameter and output a second calibration signal (OUTL).

During calibration of the given primary parameter generator (e.g., 521(1)), the controller 510 can receive the first and second calibration signals (OUTH and OUTL) and, in response during a next clock cycle, can either ADD one DAC step (i.e., change the DAC code for the given primary parameter generator so that it corresponds to the next higher DAC step), SUBTRACT one DAC step (i.e., change the DAC code for the given primary parameter generator so that it corresponds to the next lower DAC step), or HOLD the DAC code at the current DAC step because the calibration of the specific parameter generator has been achieved. The controller 510 can also stop calibration of the given primary parameter generator when certain conditions are met and trigger calibration of the next primary parameter generator in the sequence (e.g., to 521(2)).

Specifically, the controller 510 (like the controller 410 discussed above) can include a control logic block 511, an adder 514, and an N-bit counter 512.

During calibration of a given parameter generator (e.g., 521(1)), the control logic block 511 can receive the first and second calibration signals (OUTH and OUTL) and can be configured to output ADD, SUB, and NEXT signals in response to those calibration signals. An ADD signal at a logic "1" can indicate that the DAC step for the given parameter generator should be increased by one step in the next cycle, whereas an ADD signal at a logic "0" can indicate that the DAC step for the given parameter generator should not be increased in the next cycle. A SUB signal at a logic "1" can indicate that the DAC step for the given parameter generator should be decreased by one step in the next cycle, whereas a SUB signal at a logic "0" can indicate that the DAC step for the given parameter generator should not be decreased in the next cycle. A NEXT signal at a logic "0" can indicate that calibration of the given primary parameter generator should continue in the next cycle, whereas a NEXT signal at a logic "1" can cause calibration of the given primary parameter generator (e.g., 521(1)) to end and trigger initiation of calibration of the next primary parameter generator in the sequence (e.g., 421(2)).

The adder 514 can receive the current DAC code for the given primary parameter generator from a multiplexor 515 and can also receive the ADD and SUB signals from the control logic block 511 and, based on the ADD and SUB signals, can output a new DAC code (DAC_ADJ<N:0>) for that given parameter generator. If the ADD and SUB signals are both logic "0", the new DAC code will be the same as the previous DAC code. If the ADD signal is a logic "0" and the SUB signal is a logic "1", then the new DAC code will correspond to a DAC step that is one lower. If the ADD signal is a logic "1" and the SUB signal is a logic "0", then the new DAC code will correspond to a DAC step that is one higher.

The N-bit counter 512 can receive the NEXT signal. When the NEXT signal is a logic "0", the N-bit counter 512 can cause calibration of the given parameter generator to continue in the next cycle. When the NEXT signal is a logic "1", the N-bit counter 512 can cause calibration of the next parameter generator in the sequence to be initiated in the next cycle. It should be noted that, when the given parameter generator being calibrated is the last one in the sequence (i.e., 521(n)) and the NEXT signal is a logic "1", the N-bit counter 512 can cause calibration of the first one (i.e., 521(1)) in the sequence to be repeated and so on. Again, it should also be noted that the particular order in which the parameter generators 521(1)-521(n) are calibrated could be established based on whether the parameter that is output from one generator is dependent on the parameter that is output from another. For example, in one exemplary voltage generation system, a first voltage generator could generate a first voltage and a second voltage generator could generate a second voltage, where the level of the second voltage is dependent upon the level of the first voltage. In this case, the order in which the parameter generators are calibrated could be established by design so that the second voltage generator should be calibrated following the first voltage generator. However, since the calibration procedure is automatically repeated in a round-robin fashion (i.e., since calibration of the parameter generators 521(1)-521(n) is automatically, sequentially, and repeatedly performed), it is not necessary to establish the order based on whether the parameter that is output from one generator is dependent on the parameter that is output from another.

As mentioned above, the control logic block 511 can be configured to output the NEXT signal. Specifically, the control logic block 511 can be configured to switch the NEXT signal to a logic "1" when both the ADD and SUB signals are at logic "0", thereby indicating that no change to the current DAC code is necessary and that calibration is complete. Optionally, the control logic block 511 can also be configured to switch the NEXT signal to a logic "1" when any of the following conditions occur: (a) the adder 514 is a ripple carry adder, the maximum level of the adder has been reached (i.e., the highest DAC step has been reached), and the ADD signal is at a logic "1" (referred to herein as an overflow state (OVRFLWP); (b) the adder 514 is a ripple carry adder, the minimum level of the adder has been reached (i.e., the lowest DAC step has been reached), and the SUB signal is at a logic "1" (referred to herein as an underflow state (UNDRFLWP); or (c) chatter occurs from cycle to cycle (i.e., the calibration results in sequential cycles are ADD at logic "1", SUB at logic "1", ADD at logic "1", and so on indicating that there is overlap in the trip point between the comparators due to process mismatch in transistors).

FIG. 5B is a schematic diagram illustrating an exemplary control logic block 511 that could be incorporated into the system 501 of FIG. 5A. The control logic block 511 can include a first logic section 560, a second logic section 570 and a third logic section 580.

In this case, because the control logic block is only processing two calibration signals (OUTH and OUTL), the first logic section 560 is less complex that the first logic section 460 in the control logic block 411 discussed above and illustrated in FIG. 4B. Specifically, the first logic section 560 can include an ADD portion and a SUB portion. The ADD portion can include an inverter 561 that receives the OUTH signal and outputs an inverted OUTH signal as an ADD signal. That is, the ADD signal will be a logic "1" when the OUTH signal is a logic "1" and vice versa. The SUB portion can include a buffer 562 that receives the OUTL signal and outputs a SUB signal. That is, the logic value of the SUB signal will be the same as the logic value of the OUTL signal.

The second and third logic sections 570 and 580 will be configured essentially the same as the second and third logic sections 470 and 480 in the control logic block 411 of FIG. 4B, discussed above. That is, the second logic section 570 can include an ADDL2 portion and a SUBL2 portion. The ADDL2 portion can include a NOR gate 571 and a latch 572. The NOR gate 571 can receive, as inputs, the ~ADD (bitwise negation) signal and the current NEXT signal and process those signals according to a conventional NOR gate truth table. That is, the output of the NOR gate will be a logic "1" when both the ~ADD (bitwise negation) and current NEXT signals are logic "0" s, otherwise it will be a logic "0". The latch 572 can latch the output from the NOR gate 571, outputting an ADDL2 signal. The SUBL2 portion can include a NOR gate 573 and a latch 574. The NOR gate 573 can receive, as inputs, the ~SUB (bitwise negation) signal and the current NEXT signal and process those signals according to a conventional NOR gate truth table. That is, the output of the NOR gate 573 will be a logic "1" when both the ~SUB (bitwise negation) and current NEXT signals are logic "0" s, otherwise it will be a logic "0". The latch 574 can latch the output from the NOR gate 573, outputting an SUBL2 signal. The third logic section 580 can include: a NOR gate 581; two AND gates 582 and 583; an OR gate 584; a NOR gate 585; a NOR gate 586; and a NAND gate 587. The NOR gate 581 can receive and process the ADD and SUB signals. The AND gate 582 can receive and process the ADDL2 and ADD signals. The AND gate 583 can receive and process the SUBL2 and SUB signals. The OR gate 584 can receive and process the outputs of the AND gates 582 and 583. The NOR gate 585 can receive and process the outputs of the NOR gate 581 and the OR gate

584. The NOR gate 586 can receive and process overflow (OVRFLWP) and underflow (UNDRFLWP) signals. Finally, the NAND gate 587 can receive and process the outputs of the NOR gates 585 and 586, outputting the NEXT signal, which will be a logic "0" if the outputs of the NOR gates 585 and 586 are both logic "1"s, otherwise it will be a logic "1".

Thus, with this configuration, the NEXT signal at the output of the NAND gate 587 in the third logic section 580 will switch from a logic "0" to a logic "1" when any of the following conditions occur: (a) both the ADD and SUB signals are at logic "0"; (b) OVRFLWP is at a logic "1"; (c) UNDRFLWP is at a logic "1"; or (d) ADD is at logic "1" and SUB is at logic "1" in the follow-on cycle or vice versa (i.e., when there is chatter between two adjacent DACs in sequential cycles).

It should be noted because the calibration process in the embodiment of the system shown in FIGS. 5A-5B is performed based on two calibration signals (i.e., OUTH and OUTL) as opposed to three calibration signals (i.e., OUTH, OUTL and OUTM) fewer comparators are required within the calibration circuit, the complexity of the first logic section of the logic block is reduced and chip area consumption is decreased as compared to the embodiment of the system 401 shown in FIGS. 4A-4B. However, because this calibration process is performed based on two calibration signals (i.e., OUTH and OUTL) as opposed to three calibration signals (i.e., OUTH, OUTL and OUTM), the calibration results may be less accurate. Thus, the designer must balance the need for calibration accuracy with area consumption to determine the better option for a given product.

Figure 6:
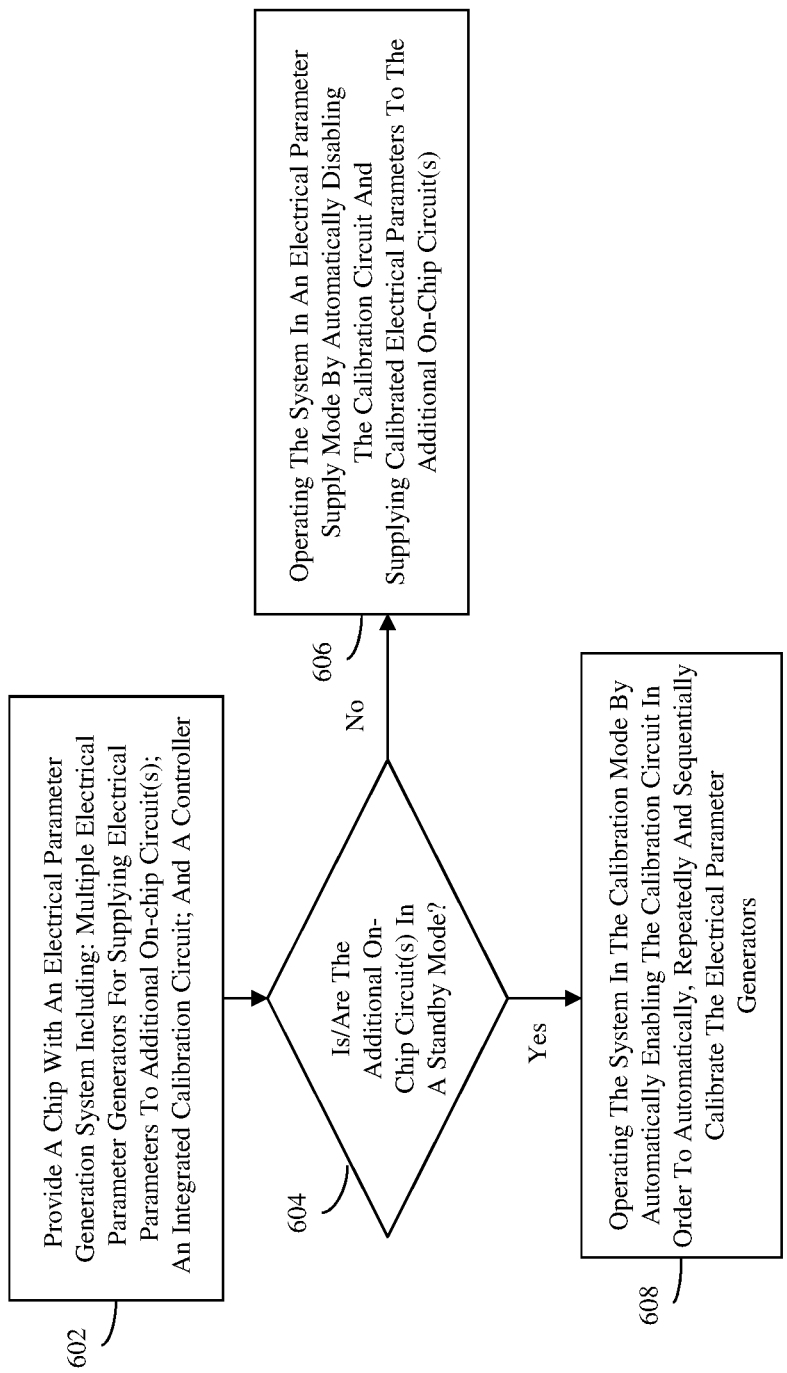
FIG. 6 is a flow diagram illustrating an embodiment of a method for operating a parameter generation system with an integrated calibration circuit.

Referring to the flow diagram of FIG. 6, also disclosed herein are embodiments of a method for operating a parameter generation system with an integrated calibration circuit.

Specifically, this method can include providing an integrated circuit (IC) chip 100, as described in detail above (see process step 602 and FIG. 1). The chip 100 can include a parameter generation system 101 and an additional on-chip circuit 199. The parameter generation system 101 can include multiple parameter generators 121(1)-121(n) configured to generate parameters 122(1)-122(n) at different levels, respectively. For example, the system 101 can be a voltage generation system with voltage generators (also referred to in the art as voltage regulators) for generating voltages at different levels, a current generation system with current generators for generating currents at different levels, a capacitance generation system with capacitance generators for generating capacitances, etc. The parameter generators 121(1)-121(n) can further be configured to output those parameters 122(1)-122(n) to the additional on-chip circuit 199. The system 101 can further include a calibration circuit 130 integrated with the parameter generators 121(1)-121(n) and a controller 110, which is in communication with the calibration circuit 130.

The method can further include determining (e.g., by the controller 110) whether or not the additional on-chip circuit 199 is in a standby mode or in an operating mode requiring the use of the parameters at the different levels (see process step 604). Depending upon whether or not the additional on-chip circuit 199 is in the standby or operating modes, the method can include selectively and alternatively operating the system 101 in either a calibration mode or a parameter supply mode. For purposes of this disclosure, "selectively and alternatively operating the system in either a calibration mode or a parameter supply mode" means that the system is operated in either the calibration mode or the parameter supply mode but not both modes concurrently.

Specifically, whenever it is determined at process step 604 that the additional on-chip circuit 199 is in a standby mode, then the system 101 can be selectively operated in the calibration mode (see process step 608). Operation of the system 101 in the calibration mode can include automatically enabling the calibration circuit 130 in order to automatically, sequentially, and repeatedly calibrate the parameter generators. This calibration process can be performed by the calibration circuit 130 and controlled by the controller 110. Operation of the system 101 in the calibration mode can also include monitoring calibration results for each parameter generator in order to determine when to stop calibration of one parameter generator and start calibration of a next parameter generator in the sequence. Calibration of a parameter generator can be stopped when it is determined that the level of the parameter being output by the parameter generator is within the predetermined range of the target level. Optionally, calibration of a parameter generator can also be stopped when any of the following conditions, as discussed in greater detail above, occur: (a) an overflow state; (b) an underflow state; or (c) chatter. It should be noted that once calibration of the last parameter generator in the sequence is complete, the sequence begins again by repeating calibration of the first parameter generator.

Whenever it is determined at process step 604 that the additional on-chip circuit 199 is in an operating mode requiring the use of the parameters, then the system 101 can be selectively operated in the parameter supply mode (see process step 606). Operation of the system 101 in the parameter supply mode can include automatically disabling the calibration circuit 130 and supplying calibrated parameters to the additional on-chip circuit 199. During each parameter supply mode, calibrated parameters will be generated by the parameter generators, respectively, and output to the additional on-chip circuit 199. Furthermore, due to the automatic, sequential, and repeated calibration that occurs at process step 608 whenever the additional on-chip circuit 199 is in the standby mode, each specific calibrated parameter output from a specific parameter generator during the parameter supply mode will be within a predetermined range of a specific target level for that specific parameter generator (e.g., a target level that is specified for operation of an additional on-chip circuit that receives the specific calibrated parameter).

Figure 7:
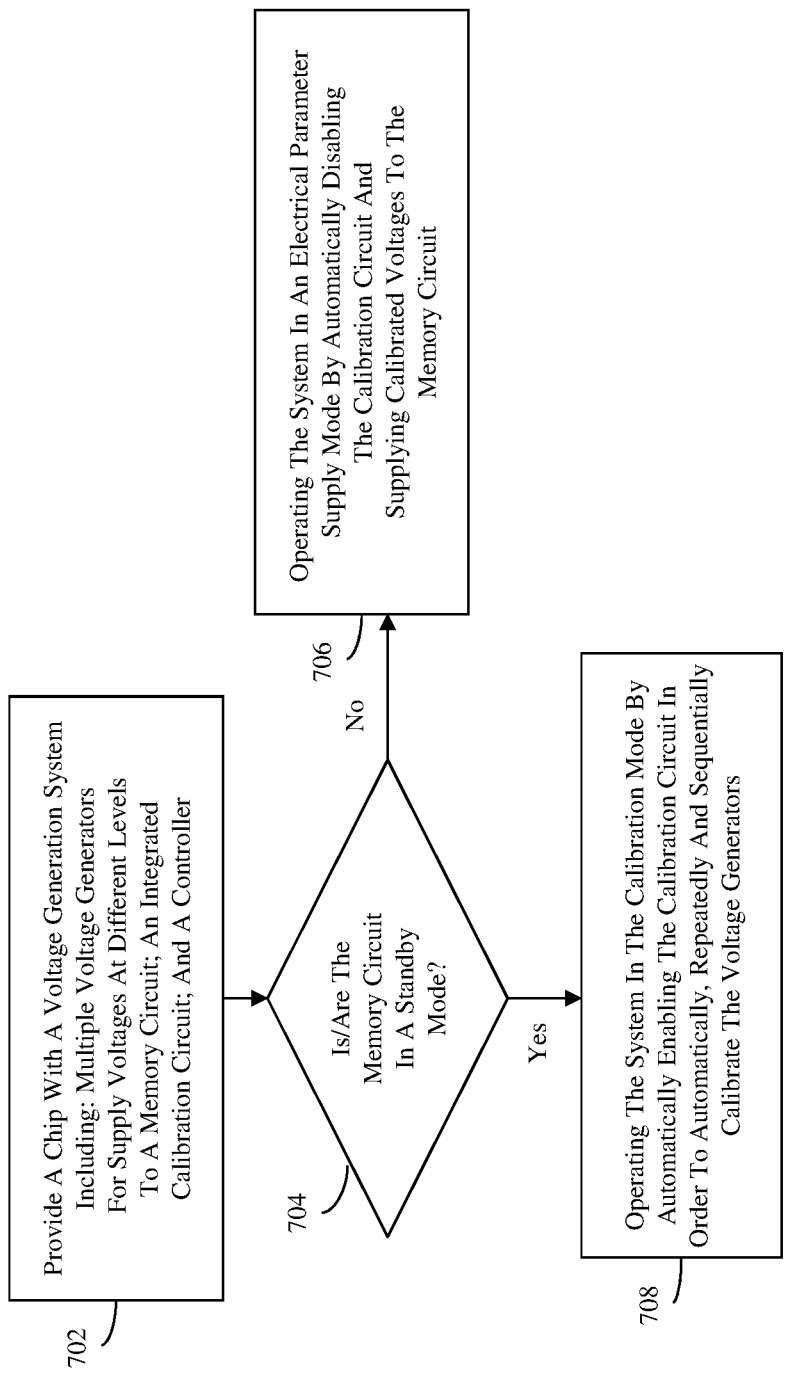
FIG. 7 is a flow diagram illustrating an embodiment of a method for operating a voltage generation system with an integrated calibration circuit.

Referring to the flow diagram of FIG. 7, also disclosed herein is an embodiment of a method specifically for operating a voltage generation system with an integrated calibration circuit.

This method can include providing an integrated circuit (IC) chip that specifically includes a voltage generation system and a memory circuit (see process step 702). The voltage generation system can include multiple voltage generators (also referred to in the art as voltage regulators) configured to generate voltages at different levels, respectively (e.g., see the DAC-based voltage generator described in detail above and illustrated in FIG. 2). The voltage generators can further be configured to output those parameters to an additional on-chip circuit. The voltage generation system can further include a calibration circuit integrated with the voltage generators and a controller, which is in communication with the calibration circuit.

The method can further include determining (e.g., by the controller) whether or not the memory circuit is in a standby mode or in an operating mode (e.g., performing read, write or erase functions) requiring the use of the supply voltages at the different levels (see process step 704). Depending upon whether or not the memory circuit is in the standby or operating modes, the method can include selectively operating the voltage generation system in either a calibration mode or a voltage supply mode.

Specifically, whenever it is determined at process step 704 that the memory circuit is in a standby mode, then the system can be selectively operated in the calibration mode (see process step 708). Operation of the system in the calibration mode can include automatically enabling the calibration circuit in order to automatically, sequentially, and repeatedly calibrate the voltage generators. This calibration process can be performed by the calibration circuit and controlled by the controller. Operation of the system in the calibration mode can also include monitoring calibration results for each voltage generator in order to determine when to stop calibration of one voltage generator and start calibration of a next voltage generator in the sequence. Calibration of a voltage generator can be stopped when it is determined that the level of the voltage being output by the voltage generator is within the predetermined range of the target level. Optionally, calibration of a voltage generator can also be stopped when any of the following conditions, as discussed in greater detail above, occur: (a) an overflow state; (b) an underflow state; or (c) chatter. It should be noted that once calibration of the last voltage generator in the sequence is complete, the sequence begins again by repeating calibration of the first voltage generator.

Whenever it is determined at process step 704 that the memory circuit is in an operating mode requiring the use of the supply voltages at the different levels, then the system can be selectively operated in the voltage supply mode (see process step 706). Operation of the system in the voltage supply mode can include automatically disabling the calibration circuit and supplying calibrated voltages to the memory circuit. During each voltage supply mode, calibrated voltages will be generated by the voltage generators, respectively, and output to the memory circuit. Furthermore, due to the automatic, sequential, and repeated calibration that occurs at process step 708 whenever the memory circuit is in the standby mode, each specific calibrated voltage output from a specific voltage generator during the voltage supply mode will be within a predetermined range of a specific target level for that specific voltage generator (e.g., a target level that is specified for operation of the memory circuit that receives the specific calibrated voltage).

Figure 8:
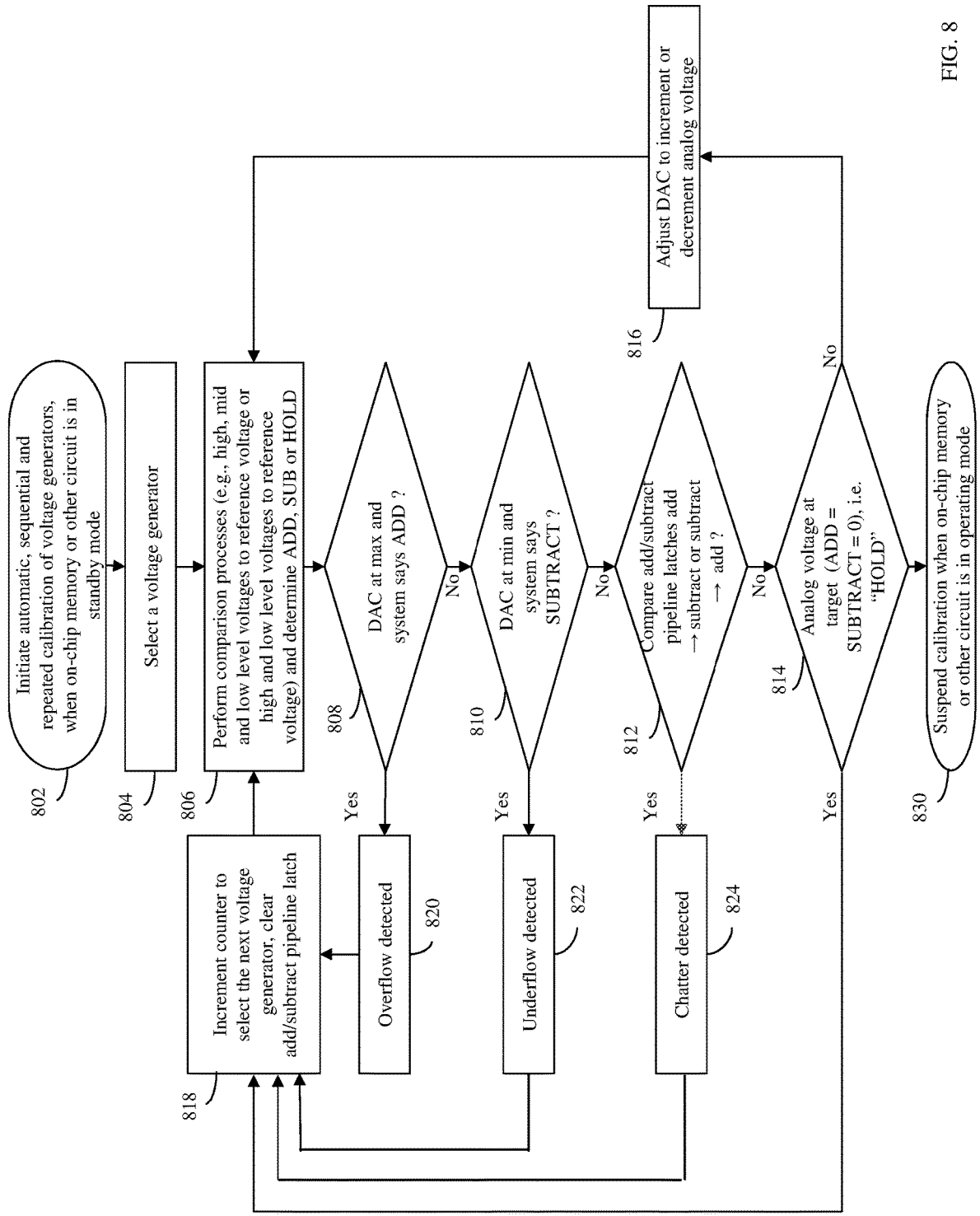
FIG. 8 is a flow diagram that illustrates an exemplary calibration process flow for parameter generators in a parameter generation system.

FIG. 8 is a flow diagram that illustrates, in greater detail, an exemplary calibration process flow for parameter generators in a parameter generation system and, particularly, for voltage generators in a voltage generation system.

Automatic, sequential and repeated calibration of the voltage generators in the voltage generation system is initiated when an on-chip memory or other on-chip circuit, which receives analog voltages at different levels from the voltage generation system, switches from an operating mode into a standby mode (see process step 802). Once the calibration process is initiated one of the voltage generators is selected for calibration (see process step 804). Then, multiple comparison processes are performed (see process step 806). As discussed in detail above, in one embodiment three comparison processes can be performed at process step 806. Specifically, a reference voltage (also referred to herein as a target voltage) for the currently selected voltage generator can be compared to the following: a mid-level voltage, which is generated by the currently selected voltage generator, in response to the current DAC code; a high-level voltage, which is one DAC step higher than the mid-level voltage; and a low-level voltage, which is one DAC step lower than the mid-level voltage. In another embodiment two comparison processes can be performed at process step 806. Specifically, a reference voltage (also referred to herein as a target voltage) for the currently selected voltage generator can be compared to the following: a high-level voltage, which is one DAC step higher than a mid-level voltage that would be generated by the selected voltage generator, in response to the current DAC code; and a low-level voltage, which is one DAC step lower than the mid-level voltage. In any case, based on the results of the comparison processes, calibration signals can be output to indicate one of the following: (a) one DAC step should be added to the current DAC code (i.e., ADD) for the currently selected voltage generator; (b) one DAC step should be subtracted from the current DAC code (i.e., SUB) for the currently selected voltage generator; or (c) the current DAC code for the currently selected generator should be held (i.e., HOLD), thereby indicating that the current DAC code will result in an analog voltage that is within one DAC step of the target voltage.

Following the comparison processes at process step 806, a determination can be made as to whether the current DAC code is at the maximum DAC step for the currently selected voltage generator and whether the result of the comparison processes is ADD (see process step 808). If the current DAC code is at the maximum DAC step for the currently selected voltage generator and the result of the comparison processes is ADD, then an overflow state is detected (see process step 820). If an overflow state is detected, then calibration of the currently selected voltage generator is stopped, the counter is incremented to select the next voltage generator in the sequence for calibration and the add/subtract pipeline latch is cleared (see process step 818). If an overflow state is not detected, then a determination can be made as to whether the current DAC code is at the minimum DAC step for the currently selected voltage generator and whether the result of the comparison processes is SUB (see process step 810).

If the current DAC code is at the minimum DAC step and the result of the comparison processes is SUB, then an underflow state is detected (see process step 822). If an underflow state is detected, then calibration of the currently selected voltage generator is stopped, the counter is incremented to select the next voltage generator in the sequence for calibration and the add/subtract pipeline latch is cleared (see process step 818). If an underflow state is not detected, then a determination can be made as to whether the latched results of sequential comparison processes for the currently selected voltage generator were ADD, then SUB or SUB, then ADD (see process step 812).

If the latched results of sequential comparison processes were ADD, then SUB or SUB, then ADD, then a chatter state is detected (see process step 824). If a chatter state is detected, then calibration of the currently selected voltage generator is stopped, the counter is incremented to select the next voltage generator in the sequence for calibration and the add/subtract pipeline latch is cleared (see process step 818). If a chatter state is not detected, then a determination can be made as to whether the result of the comparison processes is HOLD, thereby indicating that a mid-level voltage which is generated by the currently selected voltage generator in response to the current DAC code will be within an acceptable range (less than one DAC step) of the target voltage (see process step 814).

If the result of the comparison processes is HOLD, then calibration of the currently selected voltage generator is stopped, the counter is incremented to select the next voltage generator in the sequence for calibration and the add/subtract pipeline latch is cleared (see process step 818). If the result of the comparison processes is not HOLD, then the DAC code for the currently selected voltage generator is adjusted by one DAC step (i.e., up if the result of the comparison processes was ADD or down if the result of the comparison processes was SUB) in order to increment or decrement, respectively, the analog voltage that will be output from the currently selected voltage generator (see process step 816) and the comparison processes (i.e., process step 806) can be repeated for the currently selected voltage generator.

It should be understood that if calibration of the currently selected voltage generator is stopped and the counter is incremented to select the next voltage generator in the sequence for calibration at process step 818, then the above-described processes would be automatically repeated for the next voltage comparator in the sequence starting with the comparison processes at process step 806.

It should also be noted that the above-described processes would be automatically suspended, when the on-chip memory or other circuit, which receives the voltages at the different level from the voltage generation system, switches from the standby mode back to the operating mode (see process step 830).

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit chip comprising:
    an on-chip circuit that is selectively operable in standby and operating modes; and
    a parameter generation system selectively and alternatively operable in a calibration mode and a parameter supply mode, wherein the parameter generation system comprises:
      parameter generators;
      a calibration circuit integrated with the parameter generators, wherein, the calibration circuit is configured to, during the calibration mode, automatically, sequentially and repeatedly calibrate the parameter generators such that, during the parameter supply mode, each specific parameter generator generates and outputs to the on-chip circuit a specific calibrated parameter within a predetermined range of a specific target level for the specific parameter generator; and
    a controller in communication with the calibration circuit and the on-chip circuit,
    the controller being configured to enable calibration of the parameter generators by the calibration circuit when the on-chip circuit is in a standby mode and disable the calibration of the parameter generators by the calibration circuit when the on-chip circuit is in an operating mode.

2. The integrated circuit chip of claim 1, wherein the parameter generators comprise any of voltage generators, current generators and capacitance generators.

3. The integrated circuit chip of claim 1, wherein the on-chip circuit is a memory circuit, wherein the parameter generators are voltage generators that provide different supply voltages to the memory circuit, and wherein during the operating mode the memory circuit performs read, write and erase operations and the calibration of the voltage generators is disabled to prevent failures due to changes in the different supply voltages during the read, write and erase operations.

4. The integrated circuit chip of claim 1,
    wherein each parameter generator comprises a digital-to-analog converter (DAC),
    wherein, during the calibration of a specific parameter generator in sequence by the calibration circuit, the specific parameter generator receives a specific DAC code for a specific DAC step from the controller and generates three parameters at three different levels,
    wherein the three parameters comprise a low-level parameter, a high-level parameter, and a mid-level parameter,
    wherein the low-level parameter is generated at one DAC step below the specific DAC step, the mid-level parameter is generated at the specific DAC step, and the high-level parameter is generated at one DAC step above the specific DAC step,
    wherein the calibration circuit further comprises three multiplexors and three comparators,
    wherein the three multiplexors receive all low-level parameters from the parameter generators, all high-level parameters from the parameter generators, and all mid-level parameters from the parameter generators, respectively, and wherein, during the calibration of the specific parameter generator, the three multiplexors selectively apply the three parameters from the specific parameter generator to the three comparators, respectively, for comparison to a reference parameter and the controller receives three calibration signals from the three comparators, respectively, and in response during a next clock cycle, adds one DAC step, subtracts one DAC step, or holds at the specific DAC step because the calibration of the specific parameter generator has been achieved.

5. The integrated circuit chip of claim 1,
wherein each parameter generator comprises a digital-to-analog converter (DAC),
wherein, during the calibration of a specific parameter generator in sequence by the calibration circuit, the specific parameter generator receives a specific DAC code for a specific DAC step from the controller and generates two parameters at two different levels,
wherein the two parameters comprise a low-level parameter and a high-level parameter,
wherein the low-level parameter is generated at one DAC step below the specific DAC step and the high-level parameter is generated at one DAC step above the specific DAC step,
wherein the calibration circuit comprises further comprises two multiplexors and two comparators,
wherein the two multiplexors receive all low-level parameters from the parameter generators and all high-level parameters from the parameter generators, respectively, and
wherein, during the calibration of the specific parameter generator, the two multiplexors selectively apply the two parameters from the specific parameter generator to the two comparators, respectively, for comparison to a reference parameter and the controller receives two calibration signals from the two comparators, respectively, and in response during a next clock cycle, adds one DAC step, subtracts on DAC step, or holds at the specific DAC step because the calibration of the specific parameter generator has been achieved.

6. The integrated circuit chip of claim 1, wherein the controller comprises a logic block that monitors calibration results for each parameter generator in order to determine when to stop calibration of one parameter generator and start calibration of a next parameter generator.

7. The integrated circuit chip of claim 6, wherein the logic block forces the calibration of the one parameter generator to be stopped and the calibration of the next parameter generator to be started when the calibration results indicate any of the following:
add one DAC step to a maximum DAC step;
subtract one DAC step from a minimum DAC step;
neither add one DAC step, nor subtract one DAC step; and
add one DAC step followed by subtract one DAC step or vice versa in sequential cycles.

8. An integrated circuit chip comprising:
an on-chip circuit that is selectively operable in standby and operating modes; and
a voltage generation system selectively and alternatively operable in a calibration mode and a voltage supply mode, wherein the voltage generation system comprises:
voltage generators;
a calibration circuit integrated with the voltage generators, wherein, during the calibration mode, the calibration circuit automatically, sequentially and repeatedly calibrates the voltage generators such that, during the voltage supply mode, each specific voltage generator generates and outputs a specific calibrated voltage within a predetermined range of a specific target level for the specific voltage generator; and
a controller in communication with the calibration circuit and with the on-chip circuit, wherein the controller enables calibration of the voltage generators by the calibration circuit only when the on-chip circuit is in a standby mode and disables the calibration of the voltage generators by the calibration circuit when the on-chip circuit is in an operating mode.

9. The integrated circuit chip of claim 8, wherein the on-chip circuit is a memory circuit, wherein the voltage generators provide different supply voltages to the memory circuit, and wherein during the operating mode the memory circuit performs read, write and erase operations and calibration of the voltage generators is disabled to prevent failures due to changes in the different supply voltages during the read, write and erase operations.

10. The integrated circuit chip of claim 8,
wherein each voltage generator comprises a digital-to-analog converter (DAC),
wherein, during the calibration of a specific voltage generator in sequence by the calibration circuit, the specific voltage generator receives a specific DAC code for a specific DAC step from the controller and generates three voltages at three different levels,
wherein the three voltages comprise a low-level voltage, a high-level voltage, and a mid-level voltage,
wherein the low-level voltage is generated at one DAC step below the specific DAC step, the mid-level voltage is generated at the specific DAC step, and the high-level voltage is generated at one DAC step above the specific DAC step,
wherein the calibration circuit further comprises three multiplexors and three comparators,
wherein the three multiplexors receive all low-level voltages from the voltage generators, all high-level voltages from the voltage generators, and all mid-level voltages from the voltage generators, respectively, and
wherein, during the calibration of the specific voltage generator, the three multiplexors selectively apply the three voltages from the specific voltage generator to the three comparators, respectively, for comparison to a reference voltage and the controller receives three calibration signals from the three comparators, respectively, and in response during a next clock cycle, adds one DAC step, subtracts one DAC step, or holds at the specific DAC step because calibration of the specific voltage generator has been achieved.

11. The integrated circuit chip of claim 8,
wherein each voltage generator comprises a digital-to-analog converter (DAC),
wherein, during the calibration of a specific voltage generator in sequence by the calibration circuit, the specific voltage generator receives a specific DAC code for a specific DAC step from the controller and generates two voltages at two different levels,
wherein the two voltages comprise a low-level voltage and a high-level voltage,
wherein the low-level voltage is generated at one DAC step below the specific DAC step and the high-level voltage is generated at one DAC step above the specific DAC step, wherein the calibration circuit comprises further comprises two multiplexors and two comparators,
wherein the two multiplexors receive all low-level voltages from the voltage generators and all high-level voltages from the voltage generators, respectively, and wherein, during the calibration of the specific voltage generator, the two multiplexors selectively apply the two voltages from the specific voltage generator to the two comparators, respectively, for comparison to a reference voltage and the controller receives two calibration signals from the two comparators, respectively, and in response during a next clock cycle, adds one DAC step, subtracts one DAC step, or holds at the specific DAC step because calibration of the specific voltage generator has been achieved.

12. The integrated circuit chip of claim 8, wherein the controller comprises a logic block that monitors calibration results for each voltage generator in order to determine when to stop calibration of one voltage generator and start calibration of a next voltage generator.

13. The integrated circuit chip of claim 12, wherein the logic block forces the calibration of the one voltage generator to be stopped and the calibration of the next voltage generator to be started when the calibration results indicate any of the following:
   add one DAC step to a maximum DAC step;
   subtract one DAC step from a minimum DAC step;
   neither add one DAC step, nor subtract one DAC step; and
   add one DAC step followed by subtract one DAC step or vice versa in sequential cycles.

14. A method comprising:
   providing, on an integrated circuit chip, a parameter generation system comprising: parameter generators and a calibration circuit integrated with the parameter generators; and
   selectively operating the parameter generation system in one of a calibration mode and a parameter supply mode,
   wherein the parameter generation system operates in the calibration mode by automatically enabling the calibration circuit to automatically, sequentially and repeatedly calibrate the parameter generators;
   wherein the parameter generation system operates in the parameter supply mode by automatically disabling the calibration circuit and causing the parameter generators to generate and output calibrated parameters, respectively, with each specific calibrated parameter from each specific parameter generator being within a predetermined range of a specific target level for the specific parameter generator;
   wherein the calibrated parameters are output to an on-chip circuit;
   wherein the parameter generation system is operated in the calibration mode whenever the on-chip circuit is in a standby mode; and
   wherein the parameter generation system is operated in the parameter supply mode whenever the on-chip circuit is in an operating mode.

15. The method of claim 14, wherein the parameter generators comprise any of voltage generators, current generators and capacitance generators.

16. The method of claim 14, wherein the parameter generation system is a voltage generation system and the parameter generators are voltage generators.

17. The method of claim 14, further comprising, during the calibration mode, monitoring calibration results for each parameter generator in order to determine when to stop calibration of one parameter generator and start calibration of a next parameter generator.

* * * * *